(12) United States Patent
Higo et al.

(10) Patent No.: US 8,377,848 B2
(45) Date of Patent: Feb. 19, 2013

(54) DONOR SUBSTRATE AND METHOD OF MANUFACTURING DISPLAY

(75) Inventors: Tomoyuki Higo, Tokyo (JP); Keisuke Matsuo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/100,612

(22) Filed: May 4, 2011

(65) Prior Publication Data

US 2011/0206868 A1 Aug. 25, 2011

Related U.S. Application Data

(62) Division of application No. 12/489,640, filed on Jun. 23, 2009, now Pat. No. 7,956,008.

(30) Foreign Application Priority Data

Jun. 25, 2008 (JP) ................................ 2008-165971
Dec. 9, 2008 (JP) ................................ 2008-313105

(51) Int. Cl.
*B41M 5/382* (2006.01)
*B41M 5/50* (2006.01)

(52) U.S. Cl. ........................................ 503/227; 430/945

(58) Field of Classification Search ........................ None
See application file for complete search history.

(56) References Cited

FOREIGN PATENT DOCUMENTS

| JP | 09-167684 | 6/1997 |
|---|---|---|
| JP | 2001-242318 A | 9/2001 |
| JP | 2005-101553 A | 4/2005 |
| JP | 2007-141702 A | 6/2007 |
| JP | 2007-515755 | 6/2007 |
| JP | 2008-066147 | 3/2008 |

OTHER PUBLICATIONS

Japanese Office Action issued on Nov. 22, 2011 in connection with counterpart JP Application No. JP 2010-136184.

*Primary Examiner* — Bruce H Hess
(74) *Attorney, Agent, or Firm* — SNR Denton US LLP

(57) ABSTRACT

A method in which a donor substrate is used in forming a light emitting layer by forming a transfer layer containing light emission material, irradiating a radiation ray to the transfer layer while the transfer layer and a substrate to be transferred face each other, and sublimating or vaporizing the transfer layer so that the transfer layer is transferred to the substrate to be transferred. The donor substrate includes: a base; a photo-thermal conversion layer arranged on the base; and a heat interfering layer arranged between the base and the photo-thermal conversion layer, and including two or more layers with refraction index different from each other.

9 Claims, 21 Drawing Sheets

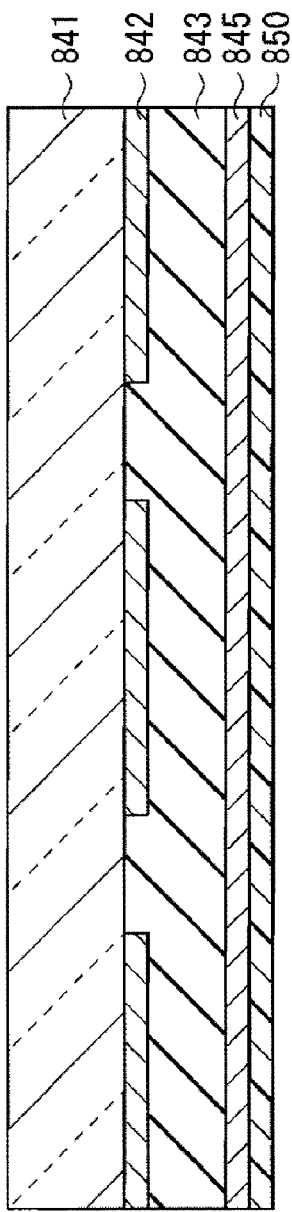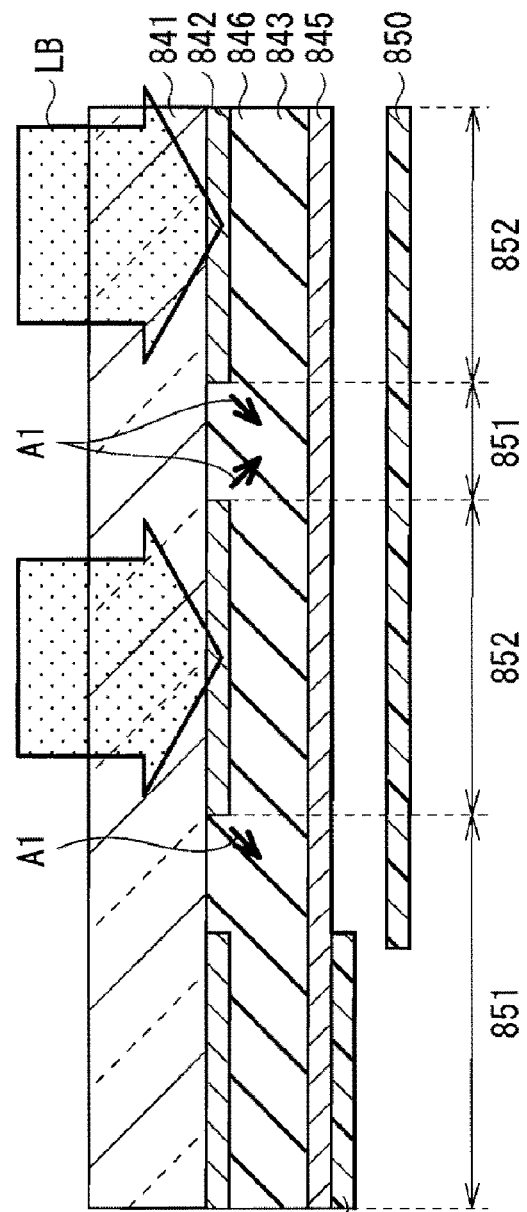
FIG. 9A RELATED ART
FIG. 9B RELATED ART

| 51 | 52 | 51 |
|---|---|---|
| UNDESIRED RANGE | DESIRED RANGE | UNDESIRED RANGE |

DONOR SUBSTRATE AND METHOD OF MANUFACTURING DISPLAY

RELATED APPLICATION DATA

This application is a division of U.S. patent application Ser. No. 12/489,640, filed Jun. 23, 2009, the entirety of which is incorporated herein by reference to the extent permitted by law. The present application claims the benefit of priority to Japanese Patent Application Nos. JP 2008-165971 filed on Jun. 25, 2008 and JP 2008-313105 filed on Dec. 9, 2008 in the Japan Patent Office, the entirety of which is incorporated by reference herein to the extent permitted by law.

BACKGROUND OF THE INVENTION

The present invention relates to a donor substrate used in forming a light emitting layer in an organic light emitting device by transfer method, and a method of manufacturing a display using such a donor substrate.

In recent years, displays for the next generation have been actively developed, and an organic light emitting display using an organic light emitting device (organic EL (electroluminescence) device) in which a first electrode, a plurality of organic layers including a light emitting layer, and a second electrode are stacked in this order on a driving substrate has attracted attention. Since the organic light emitting display is self-emitting, it has a large view angle. In the organic light emitting display, since a backlight is unnecessary, electric power saving is expected. Moreover, responsiveness is high, and low-profile of the display is possible. Therefore, it is highly desired that the organic light emitting display be applied to a large-screen display such as a television.

For the purpose of increasing size and improving productivity in such an organic light emitting display, there has been considered a use of mother glass which is further large in size. At that time, in a method of forming a light emitting layer using a typical metal mask, light emitting layers of R, G, and B are patterned by evaporating or applying light emission material, with a metal mask in between. In the metal mask, an aperture pattern is provided on a metal sheet. Thus, with the increase in size of a substrate, it is necessary to increase size of the metal mask.

However, with the increase in size of the metal mask, deflection due to weight of the mask itself and complication of delivery become remarkable, and alignment is difficult. Thus, it is difficult to sufficiently increase an aperture ratio, and device characteristics are deteriorated as a result.

As a patterning technique without using a metal mask, there is a transfer method in which a radiation ray such as a laser is used. In the transfer method, a donor element provided with a transfer layer containing light emission material as supporting material is formed, and the donor element faces a substrate to be transferred for forming the organic light emitting device. Then, the transfer layer is transferred to the substrate to be transferred by irradiating a radiation ray under a reduced-pressure environment. In addition to the laser, as the radiation ray, there is a case where light from a xenon flash lamp is condensed by a lens and used (for example, refer to Japanese Unexamined Patent Publication No. 1997-167684 (paragraphs 0017 and 0028)).

In a donor substrate of the related art, for example, a photothermal conversion layer of chrome (Cr) or the like is patterned to only a desired region (region desired to be transferred) in a base of glass or a film. In a transfer step, a transfer layer of organic material is formed on a donor substrate, and laser light is locally irradiated corresponding to the photothermal conversion layer. Thereby, only the desired range in the transfer layer is transferred to a substrate to be transferred.

SUMMARY OF THE INVENTION

However, in the case of thermal transfer by using laser, when size of the substrate is increased, there is an issue that processing time is extended and cost of the display or the like is up. Thus, a xenon flash lamp, a halogen infrared lamp, and the like are considered promising as radiation sources replacing the laser, since a collective or traversable processing may be performed in a large area. However, a donor substrate capable of efficiently absorbing a radiation ray with a wide wavelength such as a flash lamp and a halogen infrared lamp has not been developed in the related art, and large power loss occurs in the case of using a donor substrate of the related art.

Moreover, in the donor substrate of the relate art, a surface of the base and the photothermal conversion layer are covered with a heat insulating layer of $SiO_2$ or the like, and a pollution preventing layer of molybdenum (Mo) or the like is formed on the heat insulating layer. Thus, heat in a light absorbing layer is radially diffused in a plane of the pollution preventing layer, and organic material for the transfer layer is melted and slack of an outline occurs. Accordingly, not only the desired range in the transfer layer, but also an undesired range (region undesired to be transferred) is transferred. Therefore, transfer accuracy is reduced and color mixture to an immediately adjacent pixel occurs, and these bring remarkable reduction in productivity.

In view of the foregoing, it is desirable to provide a donor substrate capable of efficiently absorbing a radiation ray with a wide wavelength and a method of manufacturing a display using the donor substrate.

It is further desirable to provide a donor substrate capable of transferring a desired range in a transfer layer with high accuracy and a method of manufacturing a display using the donor substrate.

According to an embodiment of the present invention, there is provided a first donor substrate used in forming a light emitting layer by forming a transfer layer containing light emission material, irradiating a radiation ray to the transfer layer while the transfer layer and a substrate to be transferred face each other, and sublimating or vaporizing the transfer layer so that the transfer layer is transferred to the substrate to be transferred. The donor substrate includes the following components (A) to (C).

(A) a base;
(B) a photothermal conversion layer arranged on the base; and
(C) a heat interfering layer arranged between the base and the photothermal conversion layer, and including two or more layers with refraction index different from each other, According to an embodiment of the present invention, there is provided a second donor substrate used in forming a light emitting layer by forming a transfer layer containing light emission material, irradiating a radiation ray while the transfer layer and a substrate to be transferred face each other, and sublimating or vaporizing the transfer layer so that the transfer layer is transferred to the substrate to be transferred. The donor substrate includes the following components (A) to (E).

(A) a base;
(B) a photothermal conversion layer arranged on the base, corresponding to a region where a light emitting layer on the substrate to be transferred is to be formed;
(C) a heat insulating layer formed on the photothermal conversion layer and the base;

(D) a convex structure arranged in a region between the photothermal conversion layers on the heat insulating layer; and (E) a pollution preventing layer including a first portion formed on a top surface of the convex structure and a second portion formed on a top surface of the heat insulating layer, the first portion and the second portion being separated from each other.

A first method or a second method of manufacturing a display according to embodiments of the present invention in which an organic light emitting device including a first electrode, an insulating layer including an aperture corresponding to a light emitting region of the first electrode, a plurality of organic layers including a light emitting layer, and a second electrode in this order is formed on a driving substrate includes the steps of: forming the first electrode, the insulating layer, a part of the plurality of organic layers on the driving substrate, thereby forming a substrate to be transferred; forming a transfer layer containing light emission material in a donor substrate, irradiating a radiation ray while the transfer layer and the substrate to be transferred face each other, and sublimating or vaporizing the transfer layer so that the transfer layer is transferred to the substrate to be transferred, thereby forming a light emitting layer; and forming remains of the plurality of organic layers and the second electrode. As the donor substrate, the first or the second donor substrate according to the embodiments of the present invention is used.

In the first donor substrate according to the embodiment of the present invention, a heat interfering layer including two or more layers with refraction index different from each other is arranged between the base and the photothermal conversion layer. Thereby, reflectance of the heat interfering layer is adjusted depending on a light emission band of the radiation ray, and absorption when the radiation ray irradiated to the donor substrate is absorbed in the photothermal conversion layer and converted into heat is improved.

In the second donor substrate according to the embodiment of the present invention, the pollution preventing layer includes a first portion formed on a top surface of the convex structure and a second portion formed on a top surface of the heat insulating layer, and the first portion and the second portion are separated from each other. Thus, heat diffusion through the pollution preventing layer is highly reduced. Thereby, a risk that an undesired range in the transfer layer is transferred is reduced, and a desired range is transferred with high accuracy.

In the first donor substrate according to the embodiment of the present invention, a heat interfering layer including two or more layers with refraction index different from each other is arranged between the base and the photothermal conversion layer. Thereby, the absorption improves in a wide wavelength range by adjusting refraction index (material) and the thickness of the heat interfering layer.

In the second donor substrate according to the embodiment of the present invention, the pollution preventing layer includes a first portion formed on a top surface of the convex structure and a second portion formed on a top surface of the heat insulating layer, and the first portion and the second portion are separated from each other. Thereby, the heat diffusion through the pollution preventing layer is highly reduced, and the desired range in the transfer layer is transferred with high accuracy. Therefore, when manufacturing the organic light emitting display by using the donor substrate, the light emitting layer is formed with high precision without using a mask.

Other and further objects, features and advantages of the invention will appear more fully from the following description.

BRIEF DESCRIPTION OF THE DRAWINGS

FIGS. 9A and 9B are cross-sectional views for explaining an example and an issue of a donor substrate of the related art.

DETAILED DESCRIPTION OF THE PREFERRED EMBODIMENTS

Preferred embodiments of the present invention will be described in detail with reference to the accompanying drawings. The description will be made in a following order.
1. First embodiment (example where laser light is used as a radiation ray and a convex structure is provided in a donor substrate).
2. Modification 1 (example where transfer layers of different colors for each region which is separated by the convex structure are provided).
3. Second embodiment (example where a heat interfering layer with a single-layer structure is provided between a base and a photothermal conversion layer).
4. Third embodiment (example where a heat interfering layer has a stacked structure by using radiation source with a wide wavelength).

First Embodiment

Display

Figure 1:
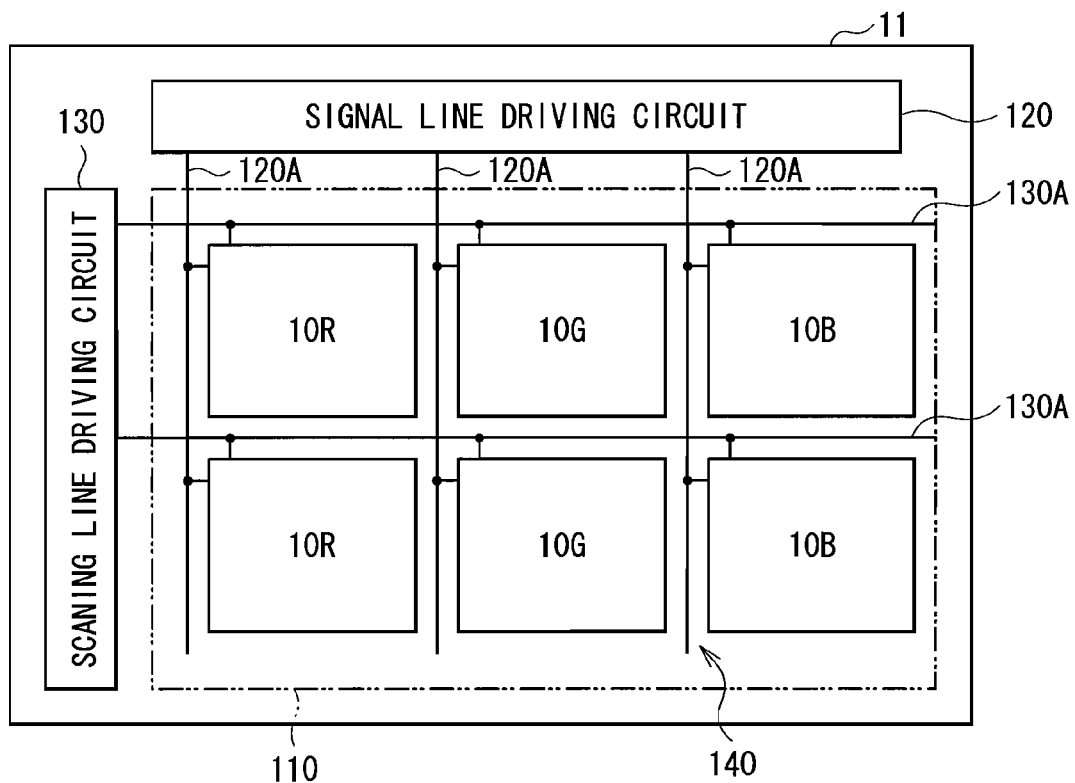
FIG. 1 is a view illustrating the configuration of a display according to a first embodiment of the present invention.

FIG. 1 illustrates the configuration of a display according to a first embodiment of the present invention. The display is used as a low-profile organic light emitting color display or the like. In the display, for example, a display region 110 in which a plurality of light emitting devices 10R, 10G, and 10B which will be described later are arranged in matrix is formed on a driving substrate 11 of glass, and a signal line driving circuit 120 and a scanning line driving circuit 130 as drivers for image display are formed in vicinity of the display region 110.

Figure 2:
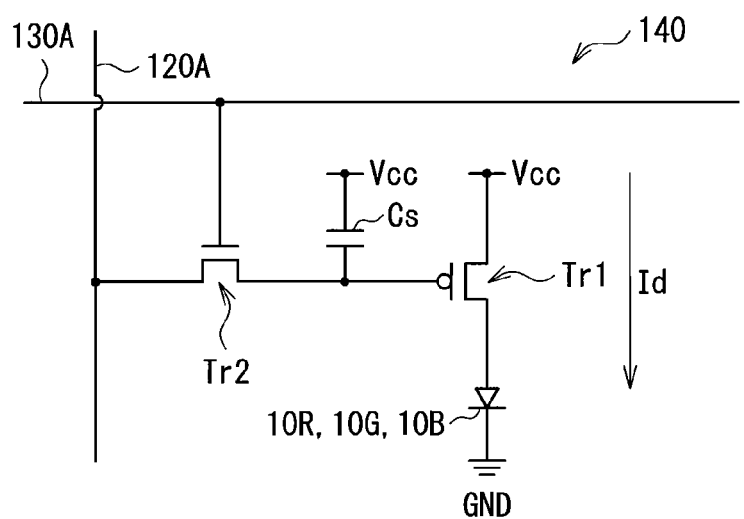
FIG. 2 is a view illustrating an example of a pixel driving circuit in FIG. 1.

In the display region 110, a pixel driving circuit 140 is formed. FIG. 2 illustrates an example of the pixel driving circuit 140. The pixel driving circuit 140 is formed in a layer level below that of a first electrode 13 which will be described later. The pixel driving circuit 140 is an active driving circuit including a driving transistor Tr1 and a writing transistor Tr2, a capacitor Cs (retention capacity) arranged between the driving transistor Tr1 and the writing transistor Tr2, and the organic light emitting device 10R (or 10G or 10B) connected in series to the driving transistor Tr1 between a first power source line (Vcc) and a second power source line (GND). The driving transistor Tr1 and the writing transistor Tr2 are configured with a typical thin film transistor (TFT). For example, the structure of the TFT is not specifically limited, and may be an inverted staggered structure (so-called bottom-gate type) or a staggered structure (top-gate type).

In the pixel driving circuit 140, a plurality of signal lines 120A are arranged in a column direction, and a plurality of scanning lines 130A are arranged in a row direction. An intersection between each signal line 120A and each scanning line 130A corresponds to either one (sub-pixel) of the organic light emitting devices 10R, 10G and 10B. Each signal line 120A is connected to the signal line driving circuit 120, and an image signal is supplied from the signal line driving circuit 120 to a source electrode of the writing transistor Tr2 through the signal line 120A. Each scanning line 130A is connected to the scanning line driving circuit 130, and a scanning signal is supplied in sequence from the scanning line driving circuit 130 to a gate electrode of the writing transistor Tr2 through the scanning line 130A.

Figure 3:
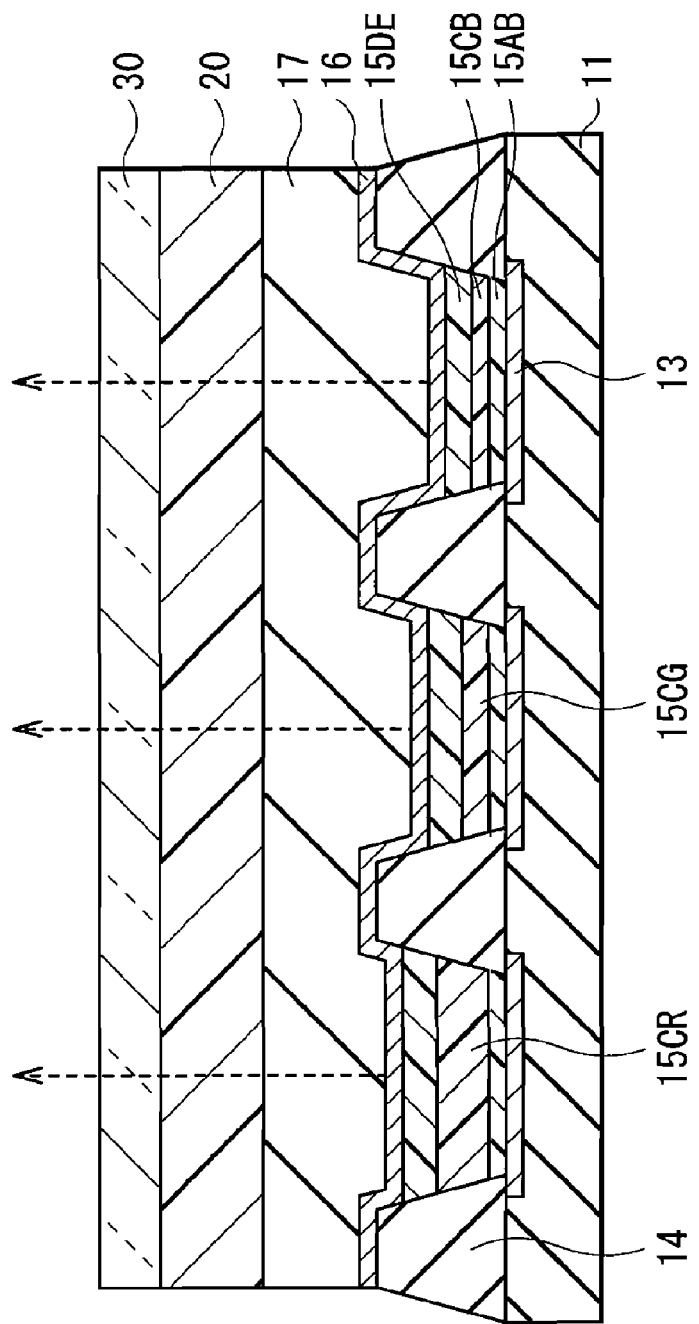
FIG. 3 is a cross-sectional view illustrating the configuration of a display region in FIG. 1.

FIG. 3 illustrates an example of the cross-sectional configuration of the display region 110. In the display region 110, the organic light emitting device 10R generating red light, the organic light emitting device 10G generating green light, and the organic light emitting device 10B generating blue light are formed in this order in matrix as a whole. The organic light emitting devices 10R, 10G, and 10B have a rectangular flat shape, and are arranged in a longitudinal direction (column direction) for each color. A combination of the organic light emitting devices 10R, 10G, and 10B immediately adjacent to one another constitute one pixel. Pixel pitch is, for example, 300 μm.

In the organic light emitting devices 10R, 10G, and 10B, a first electrode 13 as an anode, an insulating layer 14, an organic layer 15 including a red light emitting layer 15CR, a green light emitting layer 15CG, or a blue light emitting layer 15CB which will be described later, and a second electrode 16 as a cathode are stacked in this order from the driving substrate 11 side with a driving transistor (not illustrated in the figure) and a planarized insulating film (not illustrated in the figure) in the above-described pixel driving circuit 140 in between.

Such organic light emitting devices 10R, 10G, and 10B are covered with a protective film 17 of silicon nitride (SiNx) or the like. Moreover, the organic light emitting devices 10R, 10G, and 10B are sealed by adhering a sealing substrate 30 of glass or the like over the whole surface of the protective layer 17 with an adhering layer 20 in between.

The first electrode 13 is made of, for example, ITO (indium-tin composite oxide) or IZO (indium-zinc composite oxide). The first electrode 13 may be configured with a reflecting electrode. In that case, the first electrode 13 has, for example, a thickness of 100 nm or more and 1000 nm or less, and it is preferable that the first electrode 13 have reflectance as high as possible to improve light emitting efficiency. As material for the first electrode 13, for example, there is simple substance of a metal element such as chrome (Cr), gold (Au), platinum (Pt), nickel (Ni), copper (Cu), tungsten (W), or silver (Ag), or alloy of those.

The insulating layer 14 assures insulating properties between the first electrode 13 and the second electrode 16, and properly makes a light emitting region into a desirable shape. The insulating layer 14 has, for example, a thickness of approximately 1 μm, and is made of photosensitive resin such as silicon oxide or polyimide. In the insulating layer 14, an aperture is provided corresponding to a light emitting region 13A in the first electrode 13. The insulating layer 14 also serves as a convex structure on the driving substrate 11 side corresponding to a convex structure 44 in a donor substrate 40 which will be described later. The organic layer 15 and the second electrode 16 may be arranged on not only the light emitting region 13A but also the insulating layer 14 continuously. However, light emission is generated only in the aperture of the insulating layer 14.

Figure 4A:
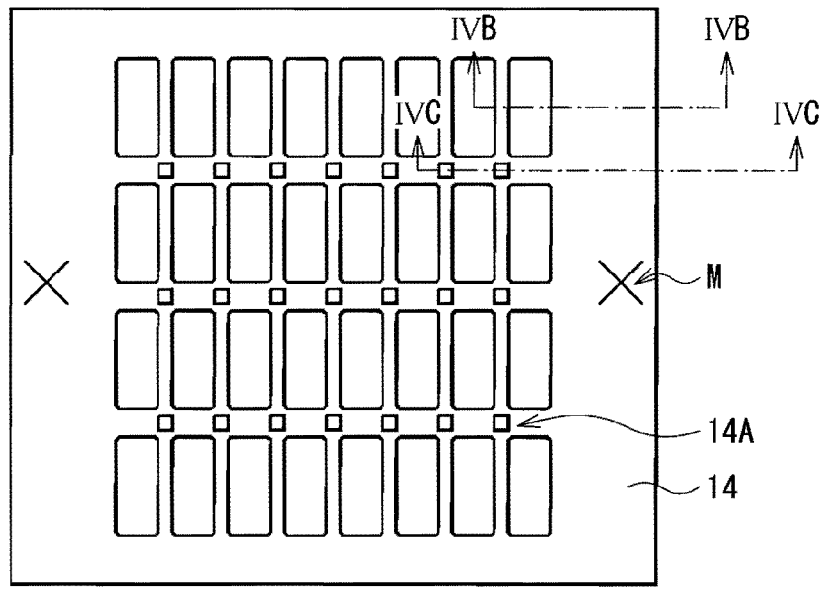
FIGS. 4A to 4C are plan views illustrating the configuration of a first electrode and an insulating layer in FIG. 3.
Figure 4B:
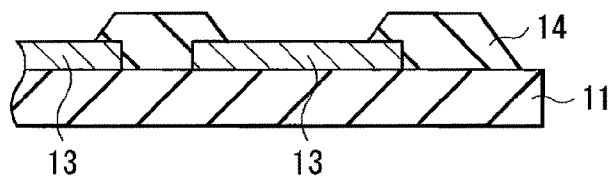
Figure 4C:
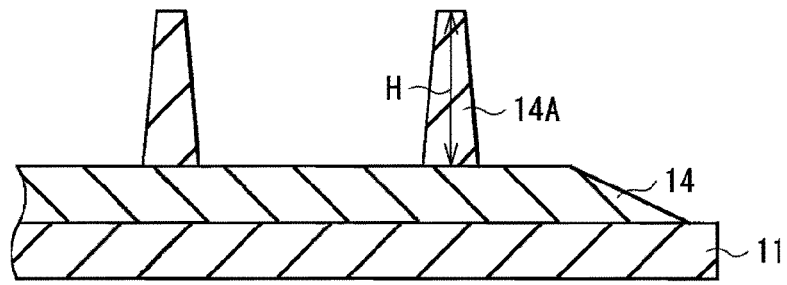

FIGS. 4A to 4C illustrate an example of the plan configuration of the first electrode 13 and the insulating layer 14. The insulating layer 14 is provided in, for example, a lattice pattern. On the insulating layer 14, a rib 14A is arranged in a position away from the light emitting region 13A in the first electrode 13 (for example, an intersection of the lattice in the insulating layer 14). The rib 14A avoids that the convex structure 44 in the donor substrate 40 and the insulating layer 14 are in contact with each other in a transfer step which will be described later. Therefore, a height H of the rib 14A is preferably higher than that of the convex structure 44, and may be, for example, approximately 5 μm. The rib 14A is made of, for example, the same material as the insulating film 14. On the driving substrate 11, an alignment mark M is provided for a position alignment with the donor substrate 40 in the transfer step which will be described later.

The organic layer 15 illustrated in FIG. 3 has a configuration in which a hole injecting layer and a hole transporting layer 15AB, the red light emitting layer 15CR, the green light emitting layer 15CG, or the blue light emitting layer 15CB, and an electron transporting layer and an electron injecting layer 15DE are stacked in this order from the first electrode 13 side. Among them, the layers except the red light emitting layer 15CR, the green light emitting layer 15CG, and the green light emitting layer 15CB may be provided if necessary. The configuration of the organic layer 15 may depend on a color of light emitted from the organic light emitting devices 10R, 10G, and 10B. The hole injecting layer increases hole injection efficiency, and is a buffer layer preventing leakage. The hole transporting layer increases hole transportation efficiency to the red light emitting layer 15CR, the green light emitting layer 15CG, or the blue light emitting layer 15CB. Recombination of an electron and a hole occurs by applying electric field, and the red light emitting layer 15CR, the green light emitting layer 15CG, or the blue light emitting layer 15CB generates light. The electron transporting layer increases electron transportation efficiency to the red light emitting layer 15CR, the green light emitting layer 15CG, or the blue light emitting layer 15CB. The electron injecting layer has, for example, a thickness of approximately 0.3 nm, and is made of LiF, $Li_2O$, or the like. In FIG. 3, the hole injecting layer and the hole transporting layer are illustrated as one layer (the hole injecting layer and the hole transporting layer 15AB), and the electron transporting layer and the electron injecting layer are illustrated as one layer (the electron transporting layer and the electron injecting layer 15DE).

The hole injecting layer in the organic light emitting device 10R has, for example, a thickness of 5 nm or more and 300 nm or less, and is made of 4,4',4"-tris(3-methyl phenyl phenylamino)triphenylamine (m-MTDATA) or 4,4',4"-tris(2-naphthyl phenyl amino)triphenylamine (2-TNATA). The hole transporting layer in the organic light emitting device 10R has, for example, a thickness of 5 nm or more and 300 nm or less, and is made of bis[(N-naphthyl)-N-phenyl]benzidine (α-NPD). The red light emitting layer 15CR in the organic light emitting device 10R has, for example, a thickness of 10 nm or more and 100 nm or less, and is configured by mixing 2,6-bis[4'-methoxydiphenylamino)styryl]-1,5-dicyanonaphthalene (BSN) as 30 weight % into 9,10-di-(2-naphthyl)anthracene (ADN). The electron transporting layer in the organic light emitting device 10R has, for example, a thickness of 5 nm or more and 300 nm or less, and is made of 8-hydroxyquinoline aluminum ($Alq_3$).

The hole injecting layer in the organic light emitting device 10G has, for example, a thickness of 5 nm or more and 300 nm or less, and is made of m-MTDATA or 2-TNATA. The hole transporting layer in the organic light emitting device 10G has, for example, a thickness of 5 nm or more and 300 nm or less, and is made of α-NPD. The green light emitting layer 15CG in the organic light emitting device 10G has, for example, a thickness of 10 nm or more and 100 nm or less, and is configured by mixing coumarin 6 as 5 volume % into ADN. The electron transporting layer in the organic light emitting device 10G has, for example, a thickness of 5 nm or more and 300 nm or less, and is made of $Alq_3$.

The hole injecting layer in the organic light emitting device 10B has, for example, a thickness of 5 nm or more and 300 nm or less, and is made of m-MTDATA or 2-TNATA. The hole transporting layer in the organic light emitting device 10B has, for example, a thickness of 5 nm or more and 300 nm or less, and is made of α-NPD. The blue light emitting layer 15CB in the organic light emitting device 10B has, for example, a thickness of 10 nm or more and 100 nm or less, and is configured by mixing 4,4'-bis[2-{4-(N,N-diphenylamino)phenyl}vinyl]biphenyl (DPAVBi) as 2.5 weight % into ADN. The electron transporting layer in the organic light emitting device 10B has, for example, a thickness of 5 nm or more and 300 nm or less, and is made of $Alq_3$.

The second electrode 16 illustrated in FIG. 3 has, for example, a thickness of 5 nm or more and 50 nm or less, and is made of simple substance of a metal element such as aluminum (Al), magnesium (Mg), calcium (Ca), or natrium (Na), or alloy of those. Among them, alloy (MgAg alloy) of magnesium and silver, and alloy (AlLi alloy) of aluminum (Al) and lithium (Li) is preferable.

The protective film 17 illustrated in FIG. 3 prevents that moisture or the like seeps into the organic layer 15. The protective film 17 is made of material having low water permeability and low water absorbability, and has a sufficient thickness. Moreover, the protective film 17 has high transmittance to light generated in the light emitting layer 15C, and is made of, for example, material having transmittance of 80% or more. Such a protective film 17 has, for example, a thickness from approximately 2 μm to 3 μm, and is made of inorganic amorphous insulating material. Specifically, amorphous silicon (α-Si), amorphous silicon carbide (α-SiC), amorphous silicon nitride ($\alpha-Si_{1-x}N_x$), and amorphous carbon (α-C) are preferable. Since the inorganic amorphous insulating material does not constitute a grain and has low water permeability, the protective film 17 is favorably formed with such material. The protective film 17 may be made of transparent conductive material such as ITO.

The adhering layer 20 illustrated in FIG. 3 is made of, for example, heat curable resin or ultraviolet curable resin.

The sealing substrate 30 illustrated in FIG. 3 is placed on the second electrode 16 side of the organic light emitting devices 10R, 10G, and 10B. The sealing substrate 30 seals the organic light emitting devices 10R, 10G, and 10B in cooperation with the adhering layer 20, and is made of material such as transparent glass which has high transmittance to light generated in the organic light emitting devices 10R, 10G, and 10B. In the sealing substrate 30, for example, a color filter (not illustrated in the figure) is provided. The color filter takes out light generated in the organic light emitting devices 10R, 10G, and 10B, and absorbs natural light reflected by the organic light emitting devices 10R, 10G, and 10B, and by wiring between the organic light emitting devices 10R, 10G, and 10B to improve contrast.

Donor Substrate

Next, the donor substrate used in the method of manufacturing the display will be described.

Figure 5:
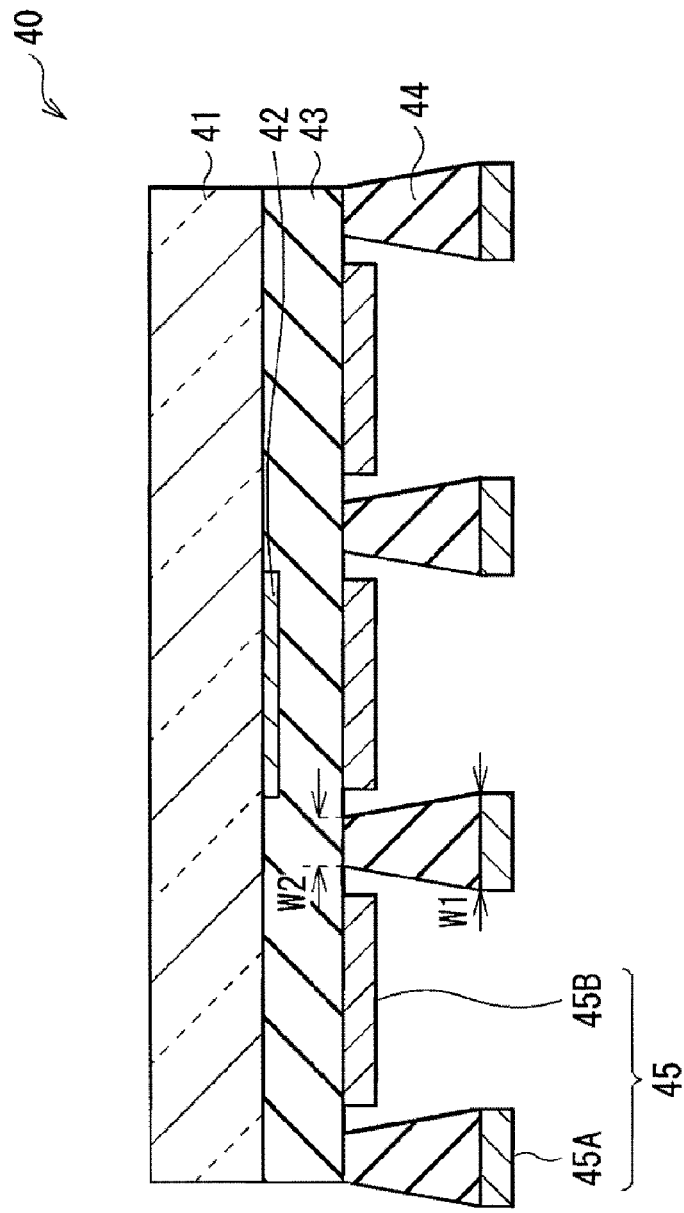
FIG. 5 is a cross-sectional plan view illustrating the configuration of a donor substrate used in a method of manufacturing the display in FIG. 1.

FIG. 5 illustrates the configuration of the donor substrate. The donor substrate 40 is used in a step of forming the red light emitting layer 15CR, the green light emitting layer 15CG, or the blue light emitting layer 15CB by transfer method. In the donor substrate 40, a photothermal conversion layer 42, a heat insulating layer 43, the convex structure 44, and a pollution preventing layer 45 are stacked in this order on a base 41.

As will be described later, the base 41 is used when forming the transfer layer containing light emission material constituting the red light emitting layer 15CR, the green light emitting layer 15CG, or the blue light emitting layer 15CB. The base 41 is made of material having firmness with which position alignment with a substrate to be transferred which will be described later is possible, and having high transmittance to laser light. For example, the base 41 is made of glass or a film.

The photothermal conversion layer 42 absorbs laser light and converts the laser light into heat, and is made of metal material having high absorption such as molybdenum (Mo), chrome (Cr), titanium (Ti), or tin (Sn), or alloy containing those. The photothermal conversion layer 42 is, for example, formed in a stripe shape with a width of 100 µm corresponding to a region (light emitting region 13A) where the red light emitting layer 15CR, the green light emitting layer 15CG, or the blue light emitting layer 15CB on the driving substrate 11 is desired to be formed.

The heat insulating layer 43 suppresses heat diffusion from the photothermal conversion layer 42, and is formed over the whole surface of the photothermal conversion layer 42 and the base 41. The heat insulating layer 43 has, for example, a thickness of approximately 300 nm, and is made of $SiO_2$, SiN, SiON, or $Al_2O_3$.

The convex structure 44 is formed in a stripe shape in a region between the photothermal conversion layers 42 on the heat insulating layer 43, and is made of, for example, polyimide or acrylic resin.

By reflecting laser light irradiated to a region except the desired range in the transfer layer, the pollution preventing layer 45 protects the organic layer 15 and the pixel driving circuit 140 which are already formed on the substrate to be transferred. It is preferable that the pollution preventing layer 45 have, for example, reflectance of 85% or more in a wavelength region from 450 nm to 1500 nm. This is because when the reflectance of the pollution preventing layer 45 is low, there is a risk that the pollution preventing layer 45 absorbs light and takes heat. As material for the pollution preventing layer 45, for example, there is molybdenum (Mo), chrome (Cr), titanium (Ti), or tin (Sn), or alloy containing those.

The pollution preventing layer 45 includes a first portion 45A formed on the top surface of the convex structure 44, and a second portion 45B formed on the top surface of the heating insulating layer 43. The first portion 45A and the second portion 45B are separated from each other. Thereby, in the donor substrate 40, the desired range in the transfer layer is transferred with high accuracy.

That is, by separating the first portion 45A and the second portion 45B in the pollution preventing layer 45, the convex structure 44 serves as a heat diffusion preventing section reducing the heat diffusion through the pollution preventing layer 45. Thus, the convex structure 44 preferably has a cross section of an inverse tapered shape with a bottom width W2 smaller than a top width W1. This is because, at the time of depositing the pollution preventing layer 45, it is possible to properly separate the first portion 45A and the second portion 45B without a lithography step. Moreover, in the case where the transfer layer is formed by ink-jet method, it is possible to suppress leakage of a liquid drop to outside the convex structure 44. Specifically, a tilt angle α between the side face of the convex structure 44 and the flat surface of the base 41 is preferably 75 degrees or more and 140 degrees or less.

The convex structure 44 preferably has a height of 0.3 µm or more and 10 µm or less. When the distance between the photothermal conversion layer 42 and the first portion 45A in the pollution preventing layer 45 is set long, the heat diffusion through the heat insulating layer 43 and the convex structure 44 itself is reduced.

Moreover, the pollution preventing layer 45 preferably has a thickness of 25 nm or more and 500 nm ore less. When the thickness is less than 25 nm, laser light transmits the pollution preventing layer 45, and the sufficient efficiency is not obtained. When the thickness is more than 500 nm, it is difficult to properly separate the first portion 45A and the second portion 45B at the time of depositing the pollution preventing layer 45.

The donor substrate 40 may be manufactured in a manner described below.

Figure 6A:
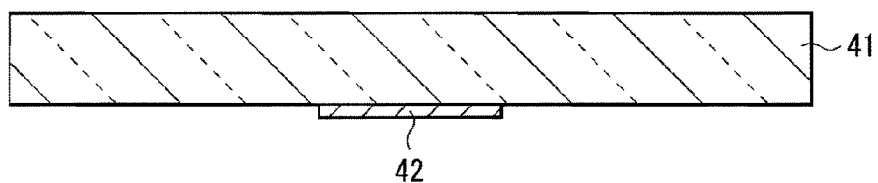
FIGS. 6A and 6B are cross sectional views illustrating a method of manufacturing the donor substrate in process order.

As illustrated in FIG. 6A, the photothermal conversion layer 42 of the above-described material is formed on the base 41 of the above-described material by, for example, sputtering method, and is shaped into a predetermined shape by photolithography and etching. Next, as illustrated in FIG. 6B, the heat insulating layer 43 of the above-described material is formed by, for example, CVD (chemical vapor deposition) method.

Figure 6B:
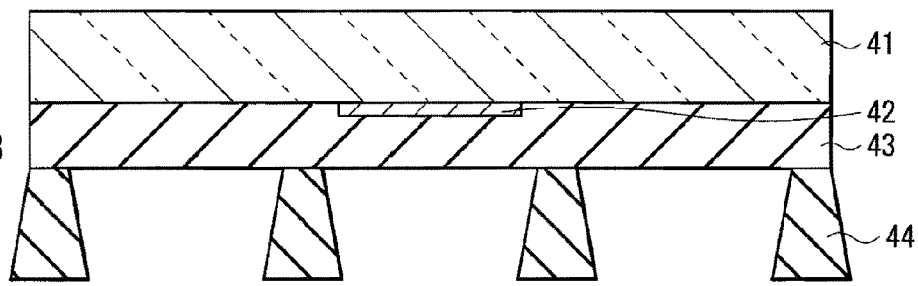

Next, as illustrated FIG. 6B, photosensitive resin is applied over the whole surface of the base 41, and is shaped into a predetermined shape by, for example, photolithography method and burned. Thereby the convex structure 44 is formed. At that time, the convex structure 44 has, for example, a height of 3 µm, and the cross section of an inverse tapered shape.

After that, the pollution preventing layer 45 of the above-described material is formed in a thickness of, for example, 150 nm by sputtering. At this time, the pollution preventing layer 45 discontinues at the side face of the convex structure 44, and is separated to the first portion 45A formed on the top surface of the convex structure 44 and the second portion 45B formed on the top surface of the heat insulating layer 43. Therefore, a patterning step such as photolithography is unnecessary. In this manner, the donor substrate 40 illustrated in FIG. 5 is formed.

Method of Manufacturing Display

The display may be manufactured, for example, in a manner described below.

The first electrode 13, the insulating layer 14, and the hole injecting layer and the hole transporting layer 15AB are formed on the driving substrate 11, and thereby the substrate to be transferred 11A is formed.

That is, the driving substrate 11 of the above-described material is prepared, and the pixel driving circuit 140 is formed on the driving substrate 11. After that, a planarized insulating film (not illustrated in the figure) is formed by applying photosensitive resin over the whole surface of the driving substrate 11. The planarized insulating film is patterned to a predetermined shape by exposure and development, and a connecting hole (not illustrated in the figure) between the driving transistor Tr1 and the first electrode 13 is formed and burned.

Next, the first electrode 13 of the above-described material is formed by, for example, sputtering method, and is shaped into a predetermined shape by, for example, dry etching. In a predetermined position on the driving substrate 11, an alignment mark used for the position alignment with a donor substrate in the transfer step which will be described later may be formed.

Next, the insulating layer 14 is formed over the whole surface of the driving substrate 11, and the aperture is provided corresponding to the light emitting region 13A in the first electrode 13 by, for example, photolithography method.

On the insulating layer 14, the rib 14A of the above-described material with the above-described height is provided in the position away from the light emitting region 13A in the first electrode 13 (for example, an intersection of the lattice in the insulating layer 14).

After that, the hole injecting layer and the hole transporting layer 15AB of the above-described material with the above-described thickness is deposited in order by, for example, evaporation method using an area mask. Thereby, the substrate to be transferred 11A is formed.

Figure 7A:
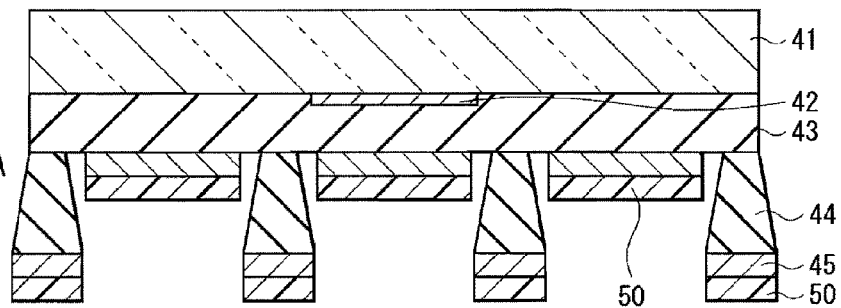
FIGS. 7A and 7B are cross sectional views illustrating a method of manufacturing the display in FIG. 1 in process order.

After forming the substrate to be transferred 11A, a plurality of the above-described donor substrates 40 are prepared, and either one of a red, green, or blue transfer layer 50 is formed in each donor substrate 40 by, for example, vacuum evaporation method as illustrated in FIG. 7A.

Figure 7B:
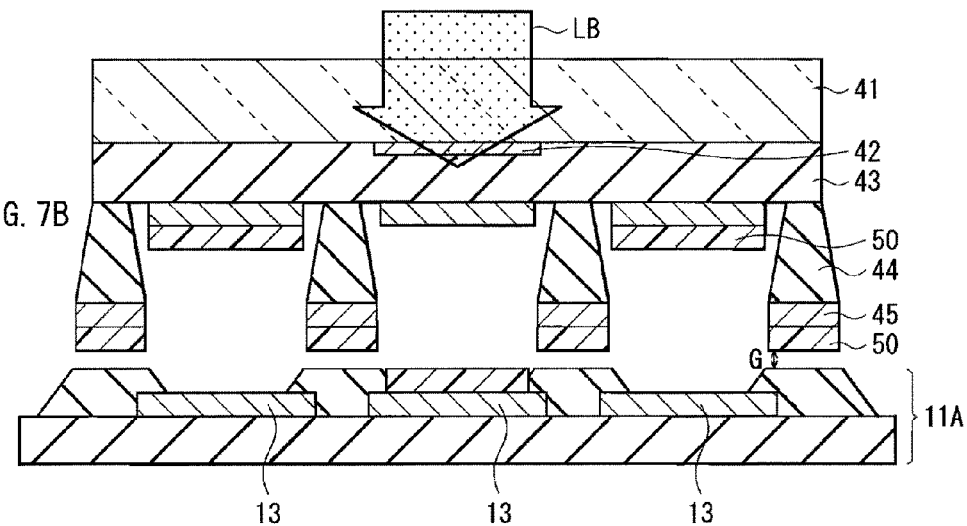
Figure 8:
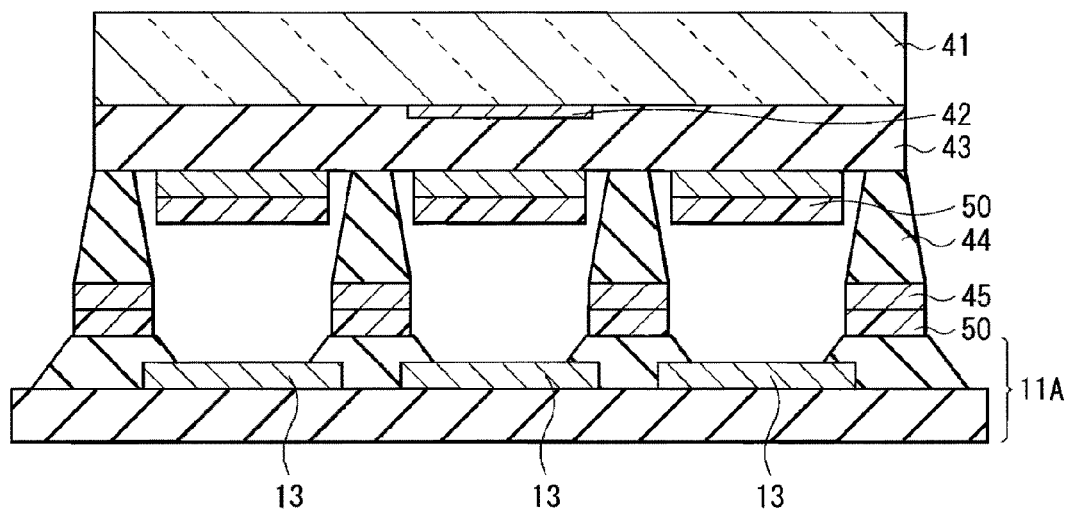
FIG. 8 is a cross-sectional view for explaining operation of a rib in FIGS. 4A to 4C.

Next, the red light emitting layer 15CR, the green light emitting layer 15CG, or the blue light emitting layer 15CB is formed by transfer method using the donor substrate 40. That is, as illustrated in FIG. 7B, for example, when forming the red light emitting layer 15CR, the transfer layer 50 in the donor substrate 40 faces the substrate to be transferred 11A. At that time, since the rib 14A (refer to FIGS. 4A to 4C) is provided on the insulating film 14 in the substrate to be transferred 11A, a space G is formed between the convex structure 44 in the donor substrate 40 and the insulating layer 14. Thus, as illustrated in FIG. 8, the convex structure 44 and the insulating layer 14 are not in contact with each other. Therefore, deterioration of image quality caused by a light emission line or the like is avoided while suppressing generation of steps in the deposited organic layer 15 due to the contact between the convex structure 44 and the insulating layer 14.

Next, as illustrated in FIG. 7B, a laser light LB is irradiated from the rear surface side of the donor substrate 40, and the transfer layer 50 is sublimated or vaporized and thus transferred to the substrate to be transferred 11A. Thereby, the red light emitting layer 15CR is formed. Here, the pollution preventing layer 45 includes the first portion 45A formed on the top surface of the convex structure 44 and the second portion 45B formed on the top surface of the heat insulating layer 43, and the first portion 45A and the second portion 45B are separated from each other. Thereby, the heat diffusion through the pollution preventing layer 45 is highly reduced. Therefore, a risk that the undesired range in the transfer layer 50 is transferred is reduced, and the desired range is transferred with high accuracy.

On the other hand, as illustrated in FIG. 9A, in a donor substrate of the related art, since a pollution preventing layer 845 is continuously formed over the whole surface of a heat insulating layer 844, heat from a photoelectric conversion layer 842 is radially diffused in a plane of the pollution preventing layer 845 as indicated with arrow A1 in FIG. 9B. Thus, organic material for a transfer layer 850 is melted and slack of the outline occurs. Accordingly, not only a desired range 852 in the transfer layer 850, but also an undesired range (region undesired to be transferred) 851 is transferred. Therefore, transfer accuracy is reduced and color mixture to an immediately adjacent pixel occurs, and these bring remarkable reduction in productivity. In FIGS. 9A and 9B, reference numerals in the 800s are used to indicate substantially identical components to those in FIGS. 5, 7A, and 7B.

Figure 10:
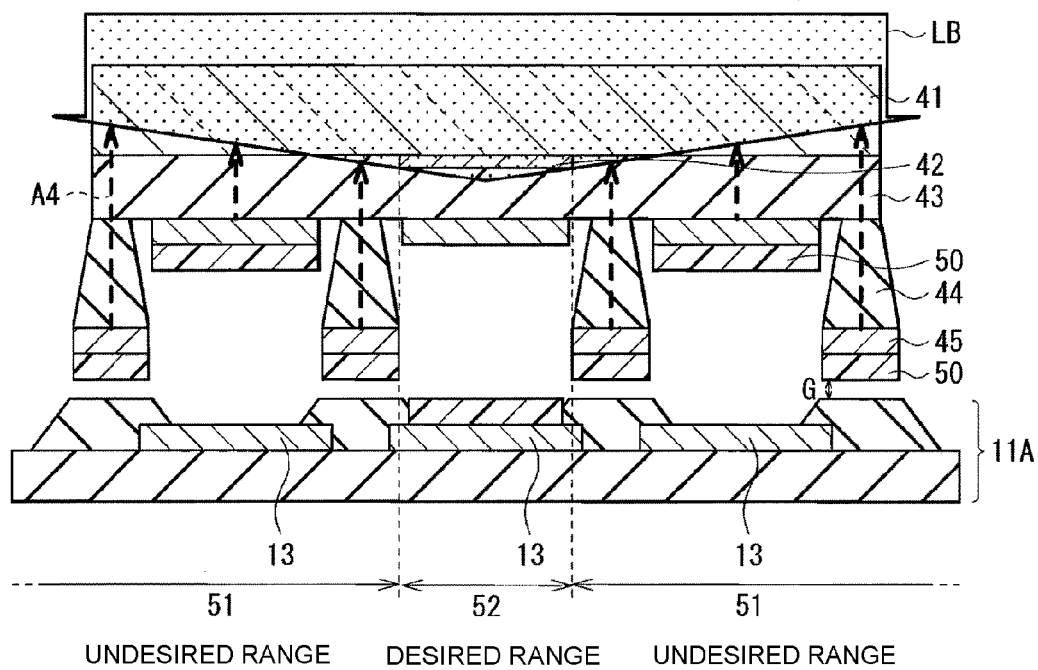
FIG. 10 is a cross-sectional view illustrating a modification of the step in FIG. 7B.

As illustrated in FIG. 10, the laser light LB may be irradiated to the whole rear surface side of the donor substrate 40. In this case, in a region where the photothermal conversion layer 42 is not formed, the laser light LB is reflected by the pollution preventing layer 45 as indicated with arrow A4, and the undesired range 51 in the transfer layer 50 is not transferred. On the other hand, in the region where the photothermal conversion layer 42 is formed, the laser light LB is absorbed in the photothermal conversion layer 42, and only the desired range 52 in the transfer layer 50 is transferred to the substrate to be transferred 11A.

After that, similarly to the red light emitting layer 15CR, the green light emitting layer 15CG or the blue light emitting layer 15CB is formed.

After forming the red light emitting layer 15CR, the green light emitting layer 15CG, or the blue light emitting layer 15CB, the donor substrate 40 and the substrate to be transferred 11A are separated. In the substrate to be transferred 11A, the electron transporting layer and the electron injecting layer 15DE, and the second electrode 16 are formed by, for example, evaporation method. In this manner, the organic light emitting devices 10R, 10G, and 10B are formed. After remains of the transfer layer 50 are washed and removed and the pollution preventing layer 45 is stripped by dry process or wet process, the donor substrate 40 which has been already used is repeatedly usable.

After forming the organic light emitting devices 10R, 10G, and 10B, the protective film 17 of the above-described material is formed on the organic light emitting devices 10R, 10G, and 10B. As a method of forming the protective film 17, for example, deposition method such as evaporation method or CVD method in which energy of a deposition particle is small to an extent that there is no influence to a base is preferable. The protective film 17 is preferably formed continuously after formation of the second electrode 16 without subjecting the second electrode 16 to atmosphere. Thereby, it is suppressed that the organic layer 15 is deteriorated by being subjected to moisture or oxygen in atmosphere. Moreover, to avoid the reduction in luminance caused by the deterioration of the organic layer 15, it is preferable that the deposition temperature of the protective film 17 be set at normal temperature and the deposition be performed under conditions where stress of the film is the minimum to avoid peeling of the protective film 17.

After that, the adhering layer 20 is formed on the protective film 17, and the protective film 17 and the sealing substrate 30 in which a color filter is provided are adhered with the adhering layer 20 in between. At that time, it is preferable that the face where the color filter in the sealing substrate 30 is formed be placed on the organic light emitting devices 10R, 10G, and 10B side. Thereby, the display in FIG. 1 is completed.

In the display obtained in this manner, the scanning signal is supplied from the scanning line driving circuit 130 to each pixel through a gate electrode in the writing transistor Tr2, and an image signal from the signal line driving circuit 120 is retained in a retention capacity Cs through the writing transistor Tr2. That is, the driving transistor Tr1 is on-off controlled depending on the signal retained in the retention capacity Cs. Thereby, a driving current Id is injected to each of the organic light emitting devices 10R, 10G, and 10B, and light emission is generated by recombination of a hole and an electron. This light transmits the second electrode 16, the color filter, and the sealing substrate 30, and is taken out.

In this manner, in the first embodiment, the pollution preventing layer 45 includes the first portion 45A formed on the top surface of the convex structure 44, and the second portion 45B formed on the top surface of the heat insulating layer 43, and the first portion 45A and the second portion 45B are separated from each other. Thereby, the heat diffusion through the pollution preventing layer 45 is highly reduced, and the desired range in the transfer layer 50 is transferred with high accuracy. Therefore, when the organic light emitting display is manufactured by using the donor substrate 40, the red light emitting layer 15CR, the green light emitting layer 15CG, or the blue light emitting layer 15CB is formed with high precision without using a mask.

Modification 1

Figure 11:
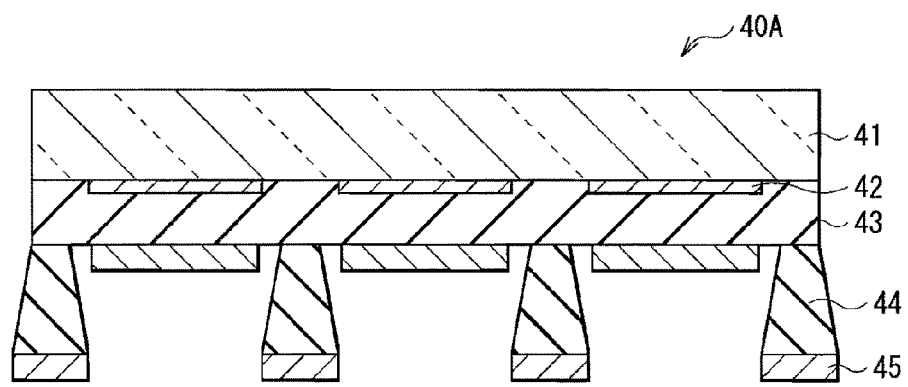
FIG. 11 is a cross-sectional view illustrating a modification of the donor substrate in FIG. 5.

FIG. 11 illustrates the configuration of a donor substrate 40A according to Modification 1 of the present invention. In the donor substrate 40A in Modification 1, a photothermal conversion layer 42 is provided for each region separated with a convex structure 44. Thereby, it is possible that a transfer layer containing light emission material of different colors for each region is formed, and the number of transfers is reduced. Except the above, the configuration is the same as the first embodiment.

The donor substrate 40A in Modification 1 may be manufactured in the same manner as in the first embodiment except that the photothermal conversion layer 42 is provided for each region separated with the convex structure 44.

Next, a method of manufacturing a display using the donor substrate 40A of Modification 1 will be described.

Similarly to the first embodiment, a first electrode 13, an insulating layer 14, and a hole injecting layer and a hole transporting layer 15AB are formed on a driving substrate 11, and thereby a substrate to be transferred 11A is formed.

Figure 12:
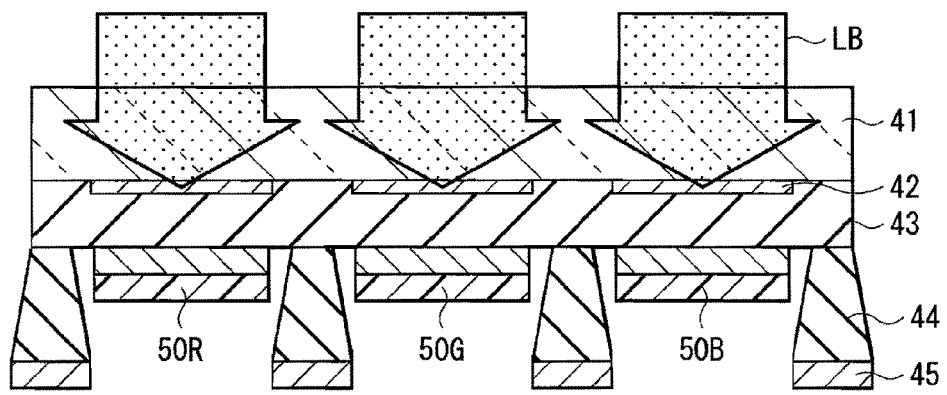
FIG. 12 is a cross-sectional view illustrating the method of manufacturing the display using the donor substrate in FIG. 11.

Next, as illustrated in FIG. 12, a red transfer layer 50R, a green transfer layer 50G, and a blue transfer layer 50B containing light emission material of different colors for each region separated by the convex structures 44 are formed by, for example, ink-jet method.

Next, as illustrated in FIG. 12, a red light emitting layer 15CR, a green light emitting layer 15CG, and a blue light emitting layer 15CB are formed in the substrate to be transferred 11A with a one-time transfer by irradiating a laser light LB. Therefore, use efficiency of the light emission material improves, and running cost is reduced. Moreover, the number of transfers is reduced, and the cost for a manufacture device is reduced and manufacturing capability improves.

Figure 13:
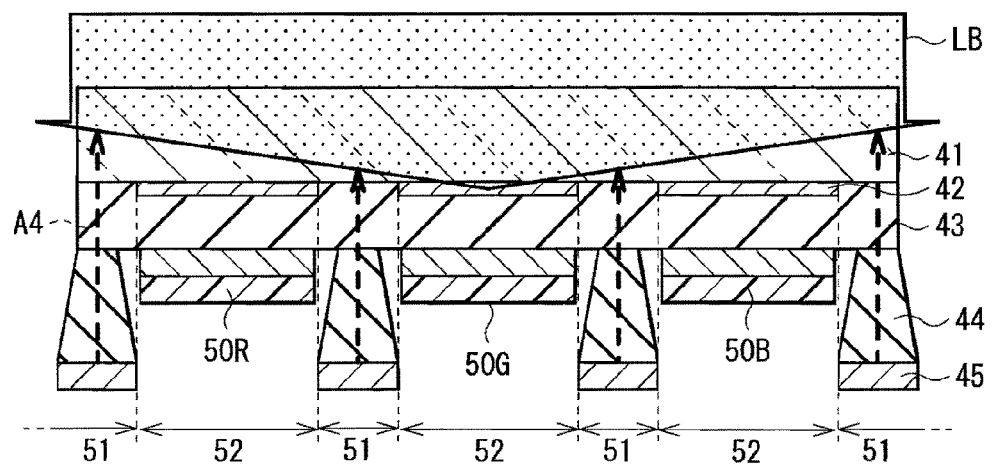
FIG. 13 is a cross-sectional view illustrating a modification of the step in FIG. 12.

As illustrated in FIG. 13, the laser light LB may be irradiated to the whole rear surface of the donor substrate 40A.

After forming the red light emitting layer 15CR, the green light emitting layer 15CG, and the blue light emitting layer 15CB, the donor substrate 40A and the substrate to be transferred 11A are separated. Similarly to the first embodiment, an electron transporting layer and an electron injecting layer 15DE, and a second electrode 16 are formed in the substrate to be transferred 11A by, for example, evaporation method. In this manner, organic light emitting devices 10R, 10G, and 10B are formed.

Similarly to the first embodiment, after forming the organic light emitting devices 10R, 10G, and 10B, a protective film 17 of the above-described material is formed on the organic light emitting devices 10R, 10G, and 10B. After that, an adhering layer 20 is formed on the protective film 17, and a sealing substrate 30 in which a color filter is formed and the protective film 17 are adhered with the adhering layer 20 in between. Thereby, the display illustrated in FIG. 1 is completed.

Second Embodiment

Figure 14:
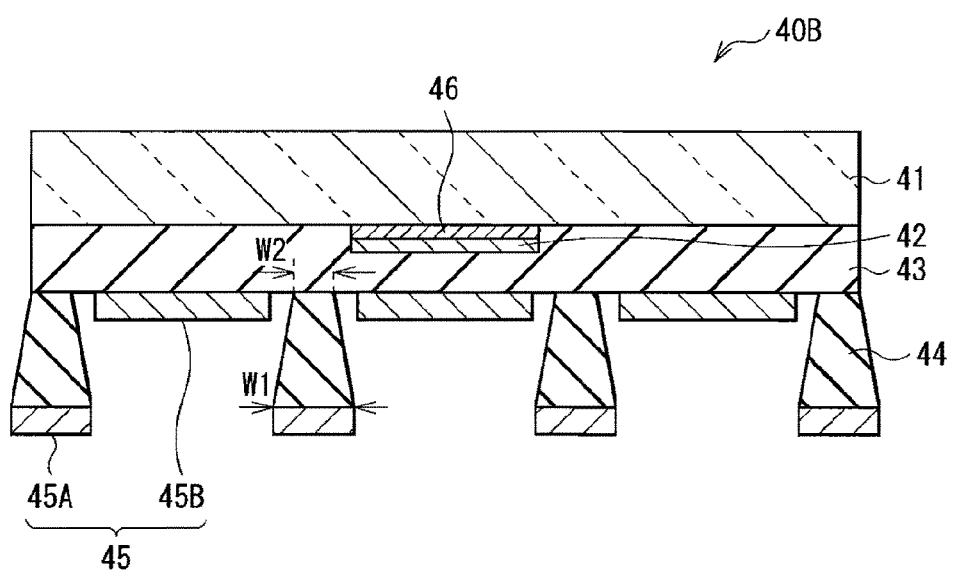
FIG. 14 is a cross-sectional view illustrating the configuration of a donor substrate according to a second embodiment of the present invention.

FIG. 14 illustrates the configuration of a donor substrate 40B according to a second embodiment of the present invention. The donor substrate 40B has the same configuration as the donor substrate 40 in the first embodiment except that a heat interfering layer 46 is provided between a base 41 and a photothermal conversion layer 42. Therefore, same reference numerals are used to indicate substantially identical components, and the descriptions are omitted.

The base 41, the photothermal conversion layer 42, a heat insulating layer 43, a convex structure 44, and a pollution preventing layer 45 are manufactured in the same manner as the first embodiment.

The heat insulating layer 46 increases absorption of a laser light LB in the photothermal conversion layer 42. The heat insulating layer 46 has, for example, a thickness of 15 nm or more and 80 nm or less, and is made of a-Si. The photothermal conversion layer 42 and the heat interfering layer 46 are arranged corresponding to a region (light emitting region 13A) where a red light emitting layer 15CR, a green light emitting layer 15CG, and a blue light emitting layer 15CB on a substrate to be transferred 11A are to be formed.

The donor substrate 40B may be manufactured in the same manner as the first embodiment except that the heat interfering layer 46 and the photothermal conversion layer 42 having the above-described thickness and made of the above-described material are continuously formed on the base 41, and then the heat interfering layer 46 and the photothermal conversion layer 42 are shaped into desirable shapes.

Similarly to the first embodiment, the donor substrate 40B may be used in the method of manufacturing a display. At that time, since the donor substrate 40B is provided with the heat interfering layer 46 between the base 41 and the photothermal conversion layer 42, the absorption of the laser light LB in the photothermal conversion layer 42 is increased and loss is suppressed in a transfer step illustrated in FIG. 7B. Moreover, it is possible that the laser light LB with low power is used.

In this manner, in the second embodiment, since the heat interfering layer 46 is provided between the base 41 and the photothermal conversion layer 42, the absorption of the laser light LB in the photothermal conversion layer 42 is increased and the loss is suppressed, and the laser light LB with the low power is usable.

Third Embodiment

Figure 15:
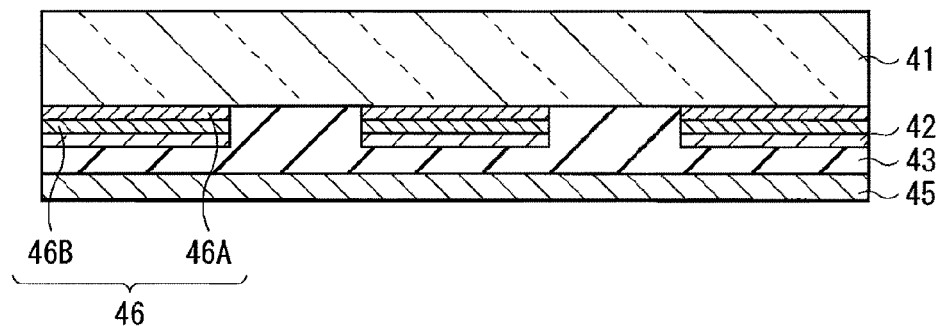
FIG. 15 is a cross-sectional view illustrating a donor substrate according to a third embodiment of the present invention.

FIG. 15 illustrates the configuration of a donor substrate 40C according to a third embodiment of the present invention. The donor substrate 40C has the same configuration as in the first embodiment and the second embodiment except that the donor substrate 40C has a stacked structure in which a heat interfering layer 46 includes two or more layers having refraction index different from each other, and a convex structure 44 is not provided. Therefore, same reference numerals are used to indicate substantially identical components.

A base 41, a photothermal conversion layer 42, and a heat insulating layer 43 are manufactured in the same manner as the first embodiment and the second embodiment.

As described above, the heat interfering layer 46 includes two or more layers having refraction index different from each other. Specifically, the heat interfering layer 46 includes, for example, a first interfering layer 46A of $SiO_2$, SiN, SiON, or $Al_2O_3$ with a thickness of 50 nm or more and 200 nm or less, and a second interfering layer 46B of a-Si with a thickness of 15 nm or more and 80 nm or less, in order from the base 41 side. Thereby, in the donor substrate 40C, a radiation ray of a xenon or krypton flash lamp, a beam halogen lamp, or the like having a wide wavelength is efficiently absorbed.

Figure 16:
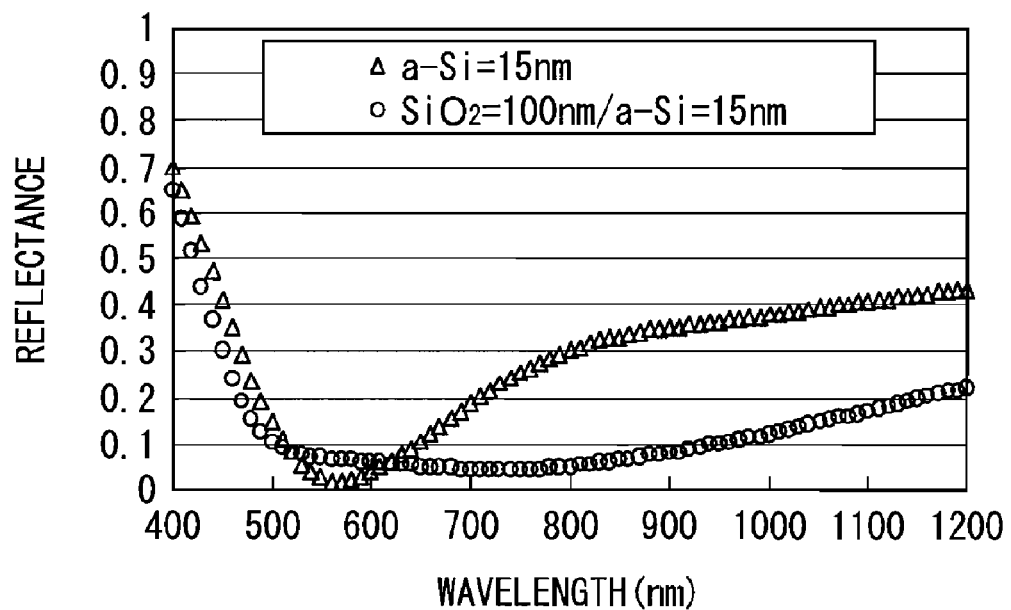
FIG. 16 is a view illustrating an absorption spectrum in a heat interfering layer.

The refraction index and the thickness of the two or more layers (for example, the first interfering layer 46A and the second interfering layer 46B) in the heat interfering layers 46 are adjusted so that reflectance in a continuous wavelength region of 100 nm or more in a light emission band of the radiation ray is 0.1 or less. FIG. 16 illustrates a comparison between an absorption spectrum of the case where the heat interfering layer 46 includes the first interfering layer 46A of $SiO_2$ with a thickness of 100 nm and the second interfering layer 46B of a-Si with a thickness of 15 nm, and an absorption spectrum of the case where the heat interfering layer 46 does not include the first interfering layer 46A (case of a single-layer structure of the second interfering layer 46B). The reflectance is calculated by a reflectance calculation method in a typical optical multilayer thin film (for example, refer to Principles of Optics, Max Born and Emil Wolf, 1974 (Pergamon press) or the like). From FIG. 16, it is understood that the absorption is high in the wide-range wavelength region in the case where the heat interfering layer 46 has the stacked structure of the first interfering layer 46A and the second interfering layer 46B in comparison with the case where the first interfering layer 46A is not provided.

Figure 17:
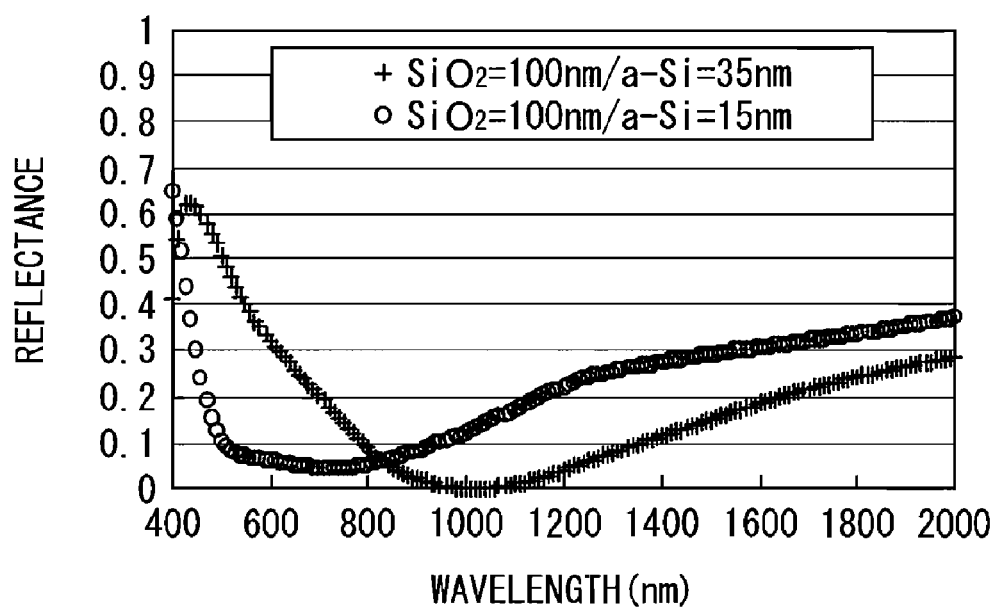
FIG. 17 is a view illustrating the absorption spectrum in the heat interfering layer.
Figure 18:
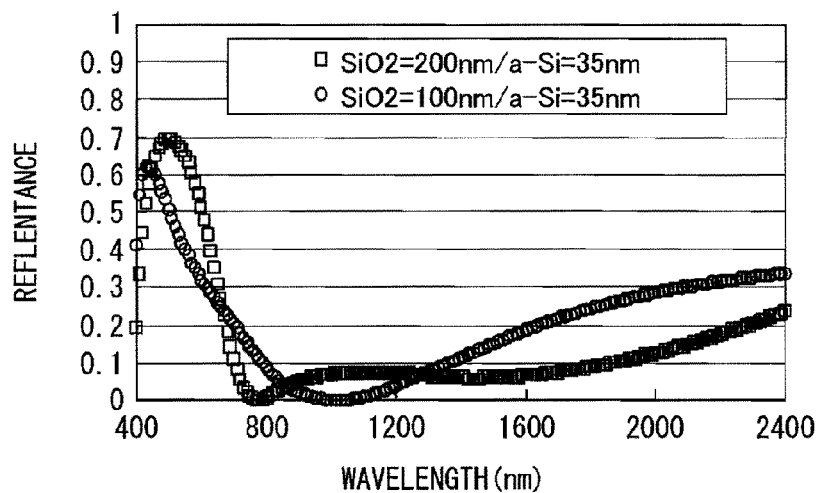
FIG. 18 is a view illustrating the absorption spectrum in the heat interfering layer.

FIG. 17 illustrates the absorption spectrum in the case where the second interfering layer 46B has a thickness of 15 nm or 35 nm. FIG. 18 illustrates the absorption spectrum in the case where the first interfering layer 46A has a thickness of 200 nm or 100 nm. From FIGS. 16 to 18, it is understood that the absorption spectrum changes when the thickness of the first interfering layer 46A or the second interfering layer 46B is changed.

In this manner, it is possible that the configuration of the heat interfering layer 46 is optimized so that the maximum absorption is obtained in accordance with the light emission spectrum of the radiation ray to be used. For example, a radiation ray of a xenon lamp, a xenon flash lamp, or the like mostly has a light emission band from approximately 400 nm to 1000 nm. Thus, from FIG. 17, it is understood that the transmittance in the continuous wavelength region of 100 nm or more in the above-described light emission band is 0.1 or less when the heat interfering layer 46 has the stacked structure with the first interfering layer 46A of $SiO_2$ having a thickness of 100 nm and the second interfering layer 46B of a-Si having a thickness of 15 nm. In this case, effects similar to those in FIG. 17 are obtained when the first interfering layer 46A has a thickness of 50 nm or more and 100 nm or less and the second interfering layer 46B has a thickness of 15 nm or more and 22 nm or less.

For example, infrared radiation heat of a halogen lamp or the like mostly has a light emission peak from approximately 900 nm to 1600 nm depending on color temperature. Therefore, from FIG. 18, it is understood that the transmittance in the continuous wavelength region of 100 nm or more in the above-described light emission band is 0.1 or less when the heat interfering layer 46 has the stacked structure with the first interfering layer 46A of $SiO_2$ having a thickness of 200 nm and the second interfering layer 46B of a-Si having a thickness of 35 nm. In this case, effects similar to those in FIG. 18 are obtained when the first interfering layer 46A has a thickness of 150 nm or more and 250 nm or less, and the second interfering layer 46B has a thickness of 35 nm or more and 80 nm or less.

By the stacked structure of the heat interfering layer 46, it is unnecessary to provide the convex structure 44 in the donor substrate 40C, and a pollution preventing layer 45 is continuously formed on the surface of the heat insulating layer 43. Therefore, the configuration and the method of manufacturing the donor substrate 40C are simplified.

The donor substrate 40C is manufactured in the same manner as the first embodiment except that, after continuously forming the first interfering layer 46A, the second interfering layer 46B, and the photothermal conversion layer 42 of the above-described material with the above-described thickness on the base 41, the first interfering layer 46A, the second interfering layer 46B, and the photothermal conversion layer 42 are shaped into predetermined shapes.

The donor substrate 40C may, for example, be used in the method of manufacturing a display as described below.

Similarly to the first embodiment, a first electrode 13, an insulating layer 14, and a hole injecting layer and a hole transporting layer 15AB are formed on a driving substrate 11, and thereby a substrate to be transferred 11A is formed.

Next, a plurality of the donor substrates 40C are prepared, and either one of a red, green, or blue transfer layer 50 is formed in each donor substrate 40C by, for example, vacuum evaporation method.

Figure 19:
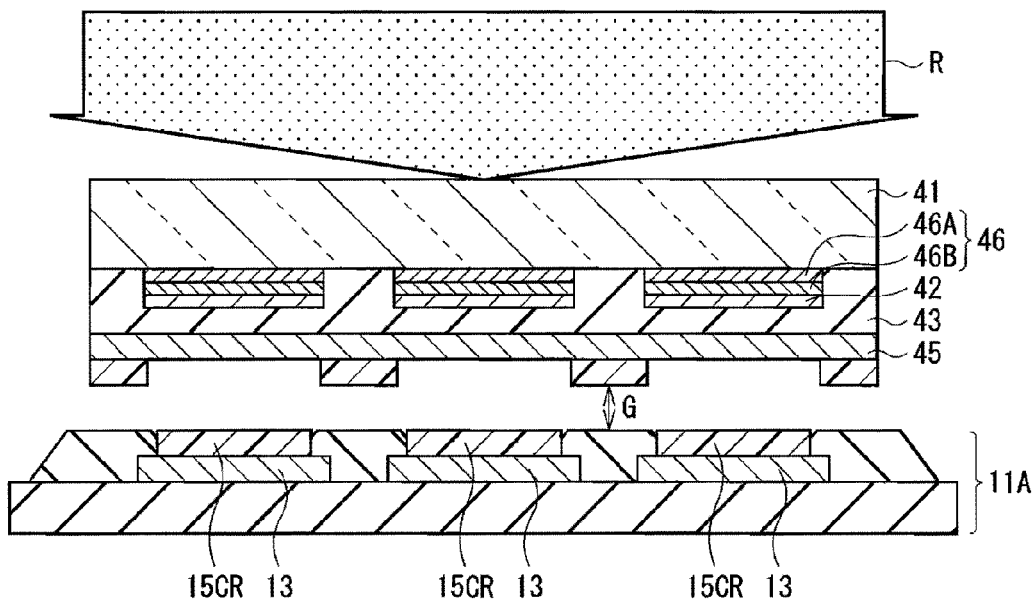
FIG. 19 is a cross-sectional view illustrating a transfer step by using the donor substrate in FIG. 15.

Next, a red light emitting layer 15CR, a green light emitting layer 15CG, or a blue light emitting layer 15CB is formed by transfer method using the donor substrate 40C. That is, as illustrated in FIG. 19, for example, when forming the red light emitting layer 15CR, the transfer layer 50 in the donor substrate 40C faces the substrate to be transferred 11A. At that time, similarly to the first embodiment, since a rib 14A (refer to FIGS. 4A to 4C) is provided on the insulating film 14 in the substrate to be transferred 11A, a space G is formed between the donor substrate 40C and the insulating layer 14. As illustrated in FIG. 8, the donor substrate 40C and the insulating layer 14 are not in contact with each other. Therefore, deterioration of image quality caused by a light emission line or the like is avoided while suppressing generation of steps in the deposited organic layer 15 due to the contact between the donor substrate 40C and the insulating layer 14.

Figure 20:
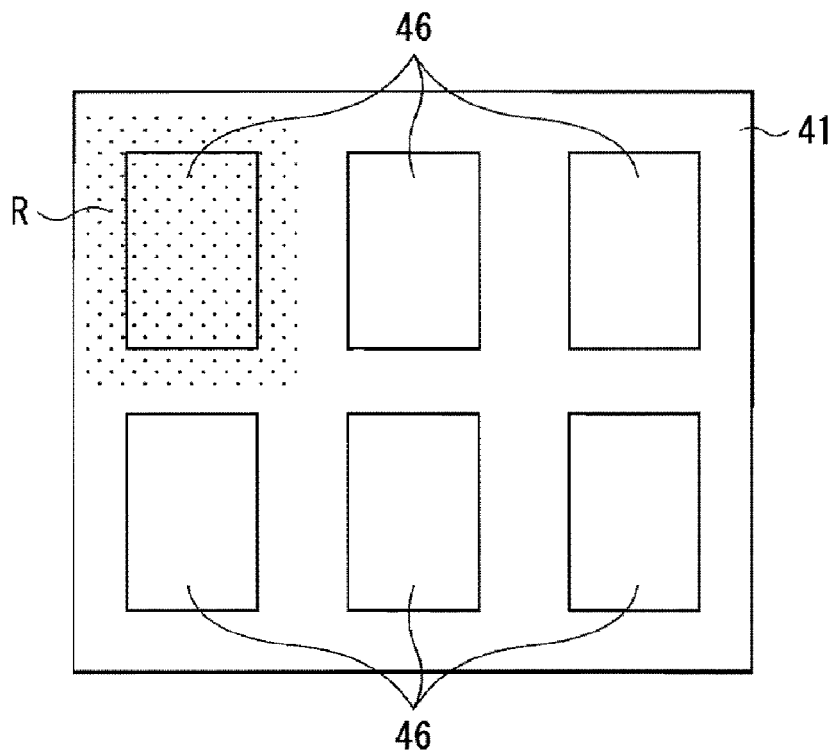
FIG. 20 is a plan view illustrating an example of a method of irradiating a radiation ray.
Figure 21:
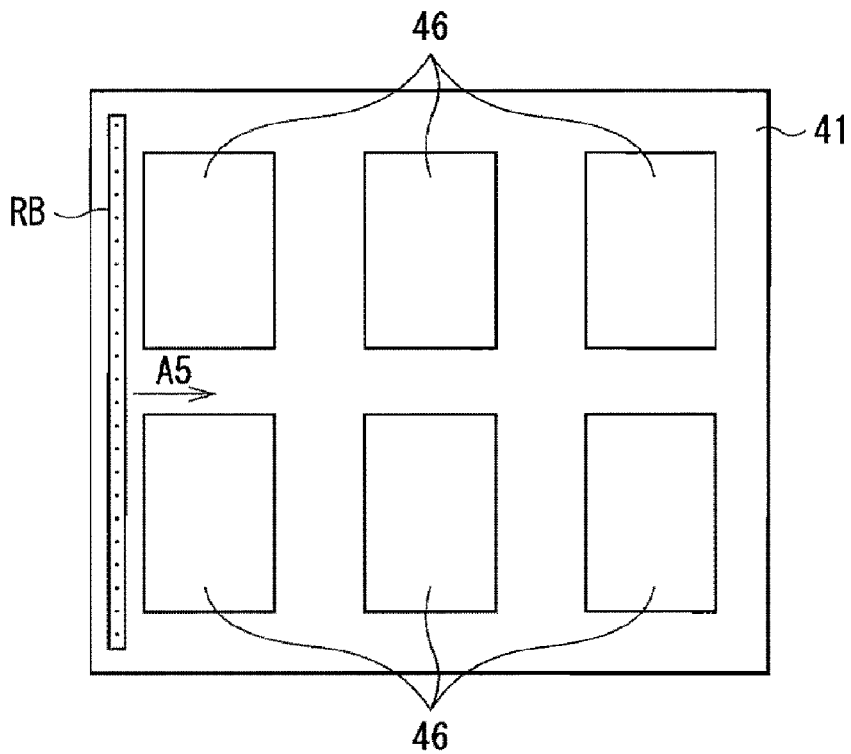
FIG. 21 is a plan view illustrating another example of the method of irradiating the radiation ray.

Next, as illustrated in FIG. 19, a radiation ray R is irradiated from the rear surface side of the donor substrate 40C, and the transfer layer 50 is sublimated or vaporized and thus transferred to the substrate to be transferred 11A. Thereby, the red light emitting layer 15CR is formed. At that time, as illustrated in FIG. 20, a plane drawing may be performed by using a xenon flash lamp as the radiation ray R. Alternatively, as illustrated in FIG. 21, a line drawing may be performed by using a line beam RB in which a halogen lamp as the radiation ray R is condensed by optical system and moving the line beam RB in a direction of arrow A5.

Here, the heat interfering layer 46 includes the first interfering layer 46A and the second interfering layer 46B having refraction index different from each other. Thereby, when the reflectance of the heat interfering layer 46 is adjusted depending on the light emission band of the radiation ray R, the absorption when the radiation ray R irradiated to the donor substrate 40C is absorbed in the photothermal conversion layer 42 and converted into heat improves. Therefore, the radiation ray R with a wide wavelength is efficiently absorbed, and the loss is suppressed. Moreover, the power used for the transfer is highly reduced.

At this time, since the radiation ray R is efficiently absorbed in the heat interfering layer 46, the heat diffusion in the pollution preventing layer 45 is reduced, and the transfer with high accuracy is possible although the pollution preventing layer 45 is not separated with the convex structure 44.

In this manner, in the third embodiment, since the heat interfering layer 46 has the stacked structure with the first interfering layer 46A and the second interfering layer 46B having refraction index different from each other, the absorption of the radiation ray R with a wide wavelength improves and the loss is suppressed, and the power used for the transfer is highly reduced.

Figure 22:
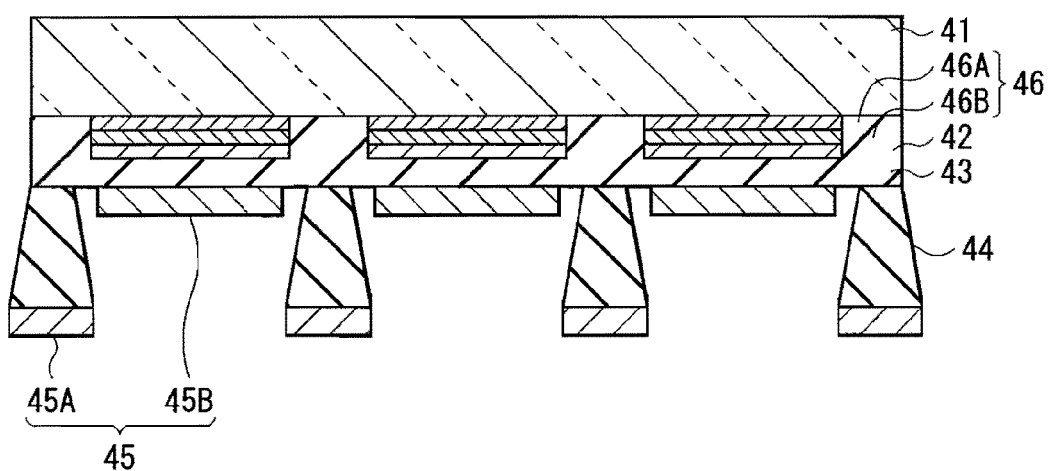
FIG. 22 is a cross-sectional view illustrating a modification of the donor substrate in FIG. 15.

In the third embodiment, the case where the pollution preventing layer 45 is continuously formed on the surface of the heat insulating layer 43 without providing the convex structure 44 is described. However, as illustrated in FIG. 22, it is also possible that the convex structure 44 is formed on the heat insulating layer 43, and a first portion 45A and a second portion 45B in the pollution preventing layer 45 are separated with the convex structure 44.

EXAMPLES

Specific examples of the present invention will be described.

Example 1

A display was manufactured in the same manner as the first embodiment. First, a first electrode 13 of ITO, an insulating layer 14 of polyimide with a thickness of 1 μm, a rib 14A of polyimide with a height of 5 μm, and a hole injecting layer and a hole transporting layer 15AB were formed on a driving substrate 11 of glass, and thereby a substrate to be transferred 11A was formed. The hole injecting layer and the hole transporting layer 15AB was formed by evaporation method. The hole injecting layer of m-MTDATA had a thickness of 25 nm, and the hole transporting layer of α-NPD had a thickness of 30 nm.

Next, a donor substrate 40 was manufactured (refer to FIG. 5). A photothermal conversion layer 42 of chrome (Cr) with a thickness of 200 nm was formed on a base 41 of glass by sputtering method. The photothermal conversion layer 42 was shaped in 100 μm in width and in a stripe shape by, for example, photolithography method. Next, a heat insulating layer 43 of $SiO_2$ with a thickness of 300 μm was formed by CVD method. A convex structure 44 of the above-described material with a thickness of 3 μm was formed. The convex structure 44 was shaped in a stripe shape, and had a cross section of an inverse taped shape.

After that, the pollution preventing layer 45 of molybdenum (Mo) with a thickness of 150 nm was formed.

A transfer layer 50 with a thickness of 25 nm was formed in the donor substrate 40 by evaporation method (refer to FIG. 7A).

Next, the donor substrate 40 was arranged on the substrate to be transferred 11A (refer to FIG. 7B). Between the donor substrate 40 and the substrate to be transferred 11A, a space G with a height of approximately 2 μm was maintained. This height of 2 μm corresponds to the difference between the height of the rib 14A as 5 μm and the height of the convex structure 44 as 3 μm. At this time, a laser light LB with a wavelength of 800 nm was irradiated from the rear surface side of the donor substrate 40, and the transfer layer 50 was transferred to the substrate to be transferred 11A (refer to FIG. 7B). A spot size of the laser light LB was fixed to 100 μm×20 μm. The laser light LB scanned in a direction orthogonal to the longitudinal direction of the spot size (swath width 100 μm).

By repeating the above steps, a red light emitting layer 15C, a green light emitting layer 15G, and a blue light emitting layer 15B were formed, and then an electron transporting layer and an electron injecting layer 15DE, and a second electrode 16 were formed by evaporation method. The electron transporting layer was made of $Alq_3$ and had a thickness of 20 nm. The electron injecting layer was made of LiF (evaporation rate of 0.01 nm/sec), and had a thickness of 0.3 nm. The second electrode 16 was made of MgAg, and had a thickness of 10 nm. After that, a protective film 17 and an adhering layer 20 were formed, and a sealing substrate 30 was adhered. Thereby, the display was completed.

Figure 23A:
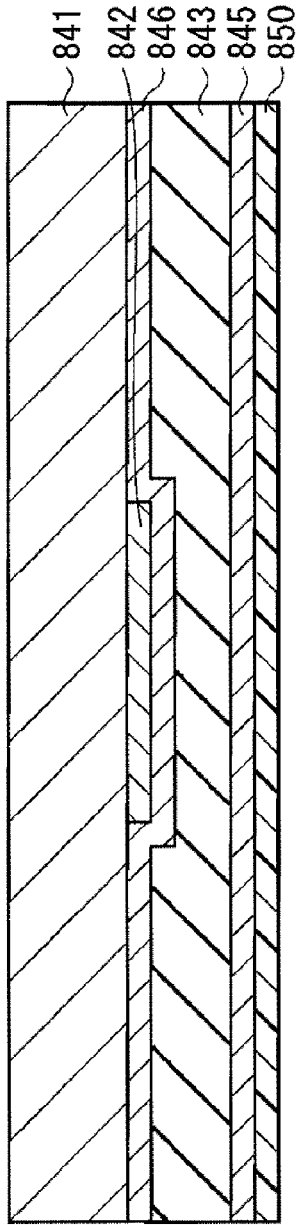
FIGS. 23A and 23B are cross-sectional views for explaining the configuration and an issue of a donor substrate in Comparative example 1.

As Comparative example 1, as illustrated in FIG. 23A, a donor substrate 840 in which a reflecting layer 846 of aluminum (Al) was provided all over between a photothermal conversion layer 842 and a heat insulating layer 843 was formed. By using the donor substrate 840, a display was manufactured in the same manner as Example 1. At that time, the reflecting layer 846 was made of aluminum (Al) and had a thickness of 100 nm.

The light emission state of the display in Example 1 and Comparative example 1 was confirmed by visual observation. Color mixture to an immediately adjacent pixel was not confirmed in Example 1. However, the color mixture to an immediately adjacent pixel was confirmed in Comparative example 1. In both of Example 1 and Comparative example 1, a width of a transferred light emitting layer was investigated. The results were indicated in Table 1.

TABLE 1

| | Presence or absence of convex structure | Color mixture to immediately adjacent pixel | Transfer width after irradiation with width of 100 μm |
|---|---|---|---|
| Example 1 | Present | Not observed | 105 μm |
| Comparative example 1 | Absent | Observed | 122 μm |

From Table 1, it was understood that when the laser light was irradiated by setting a long side (swath width) of the spot size as 100 μm, the width of the transferred light emitting layer was 105 μm in Example 1, and 122 μm in Comparative example 1. The transfer accuracy highly improved in Example 1 in comparison with Comparative example 1.

Figure 23B:
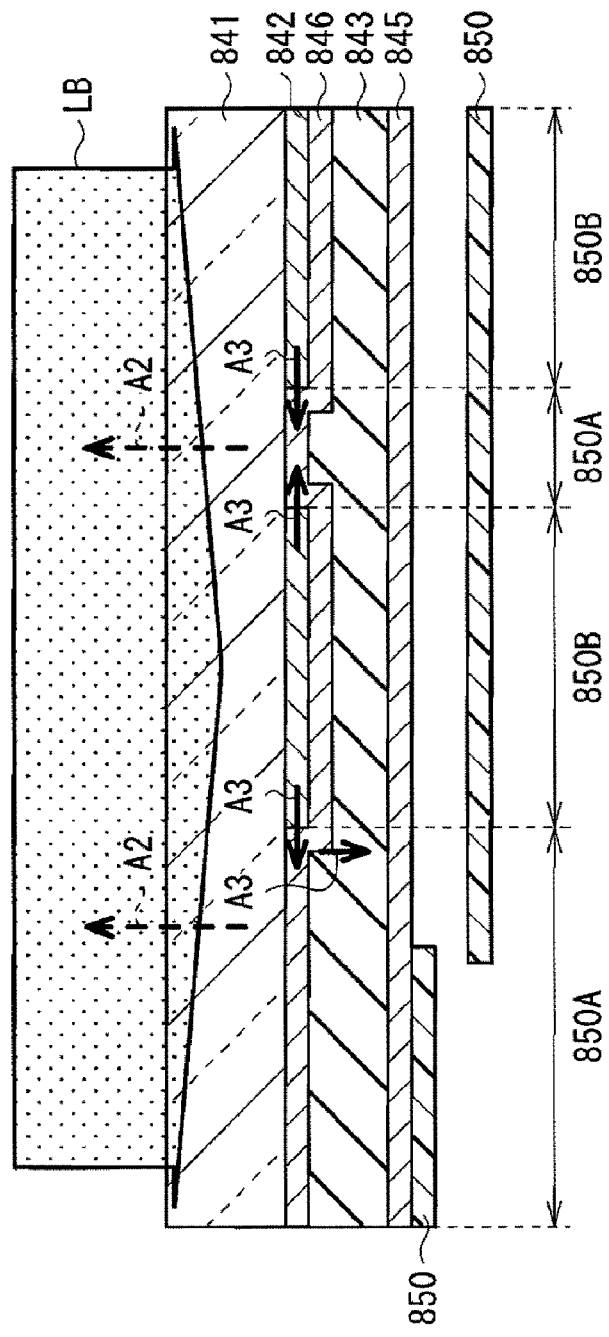

The reason may be considered as follows. In the donor substrate 840 of Comparative example 1 illustrated in FIG. 23A, when the laser light LB was irradiated to the whole surface, the laser light LB was reflected by the reflecting layer 846 in the region where the photothermal conversion layer 842 was not formed as indicated with arrow A2 in FIG. 23B. On the other hand, in the region where the photothermal conversion layer 842 was formed, the laser light LB was absorbed in the photothermal conversion layer 842, and only a desired range 852 in the transfer layer 850 was transferred to the substrate to be transferred. However, in the donor substrate 840 of Comparative example 1, heat conduction was generated in the reflecting layer 846 as indicated with arrow A3. Thus, organic material for the transfer layer 850 was melted and slack of the outline occurs. Accordingly, not only the desired range 852 in the transfer layer 850, but also an undesired range (region undesired to be transferred) 851 was transferred. Therefore, transfer accuracy was reduced and color mixture to an immediately adjacent pixel occurred.

That is, when the pollution preventing layer 45 included the first portion 45A formed on the top surface of the convex structure 44 and the second portion 45B formed on the top surface of the heat insulating layer 43, and the first portion 45A and the second portion 45B were separated from each other, the heat diffusion through the pollution preventing layer 45 was highly reduced, and the desired range in the transfer layer 50 was transferred with high accuracy.

Examples 2 and 3

A display was manufactured in the same manner as the third embodiment. At that time, in Example 2, a xenon flash lamp was used as a radiation ray R, and a transfer step was performed by a plane drawing as illustrated in FIG. 20. The configuration of a donor substrate 40C was as follows.

| | |
|---|---|
| Base 41: | glass |
| Heat interfering layer 46: | stacked structure by stacking a first interfering layer 46A of SiO$_2$ with a thickness of 100 nm and a second interfering layer 46B of a-Si with a thickness of 15 nm |
| Photothermal conversion layer 42: | titanium (Ti) with a thickness of 200 nm |
| Heat insulating layer 43: | SiO$_2$ with a thickness of 300 nm |
| Pollution preventing layer 45: | aluminum (Al) with a thickness of 50 nm |

In Example 3, a line beam RB in which a halogen lamp was condensed with optical system was used as a radiation ray R, and a transfer step was performed by a line drawing as illustrated in FIG. 21. The configuration of a donor substrate 40C was as follows.

| | |
|---|---|
| Base 41: | glass |
| Heat interfering layer 46: | stacked structure by stacking a first interfering layer 46A of SiO$_2$ with a thickness of 200 nm and a second interfering layer 46B of a-Si with a thickness of 35 nm |
| Photothermal conversion layer 42: | titanium (Ti) with a thickness of 200 nm |
| Heat insulating layer 43: | SiO$_2$ with a thickness of 300 nm |
| Pollution preventing layer 45: | aluminum (Al) with a thickness of 50 nm |

As Comparative examples 2 and 3, a display was manufactured in the same manner as Examples 2 and 3 except that a first interfering layer was not provided in a donor substrate (a single-layer structure of only a second interfering layer).

Irradiation power of the radiation ray R used in Examples 2 and 3 and Comparative examples 2 and 3 was investigated. The results were indicated in Table 2 and Table 3.

TABLE 2

Case of using flash lamp

| | Presence or absence of first interfering layer | Necessary power density (J/cm$^2$) |
|---|---|---|
| Example 2 | present | 40 |
| Comparative example 2 | absent | 320 |

TABLE 3

Case of using halogen lamp (2800 K)

| | Presence or absence of first interfering layer | Necessary power density (w/cm$^2$) |
|---|---|---|
| Example 3 | present | 400 |
| Comparative example 3 | absent | 70 |

As understood from Table 2 and Table 3, in Examples 2 and 3 where the heat interfering layer 46 had the stacked structure by stacking the first interfering layer 46A and the second interfering layer 46B having refraction index different from each other, the irradiation power was highly reduced in comparison with Comparative examples 2 and 3 where the first interfering layer was not provided. That is, when the heat interfering layer 46 had the stacked structure by stacking the first interfering layer 46A and the second interfering layer 46B having refraction index different from each other, power necessary for the transfer was highly reduced.

MODULE AND APPLICATION EXAMPLES

Hereafter, Application examples of a display described in the first to third embodiments will be described. The display according to the embodiments is applicable to a display in electronic devices in various fields such as a television, a digital camera, a notebook personal computer, a portable terminal of a cellular phone or the like, or a video camera in which an image signal input from outside or an image signal generated inside the device is displayed as a picture or image.

Module

Figure 24:
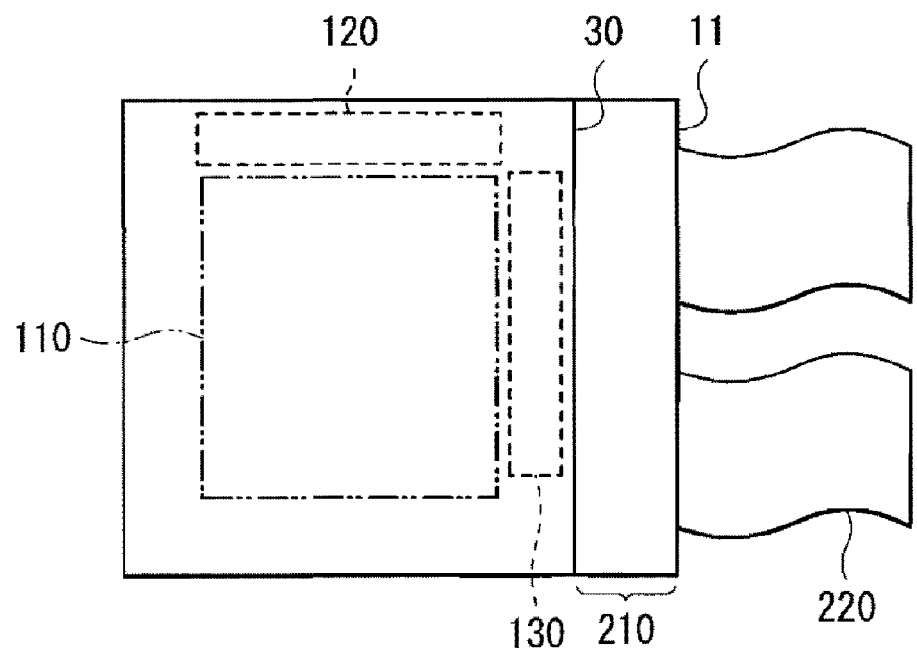
FIG. 24 is a plan view illustrating the schematic configuration of a module including the display in the first to third embodiments.

For example, as a module illustrated in FIG. 24, the display according to the embodiments is installed in various electronic devices of Application examples 1 to 5 and the like which will be described later. This module is, for example, provided with a region 210 exposed from a sealing substrate 30 and an adhering layer 20 to one side of a driving substrate 11. In the exposed region 210, a line of a signal line driving circuit 120 and a line of a scanning line driving circuit 130 are extended to form an external connecting terminal (not illustrated in the figure). In the external connecting terminal, a flexible printed circuit (FPC) 220 for inputting/outputting a signal may be provided.

Application Example 1

Figure 25:
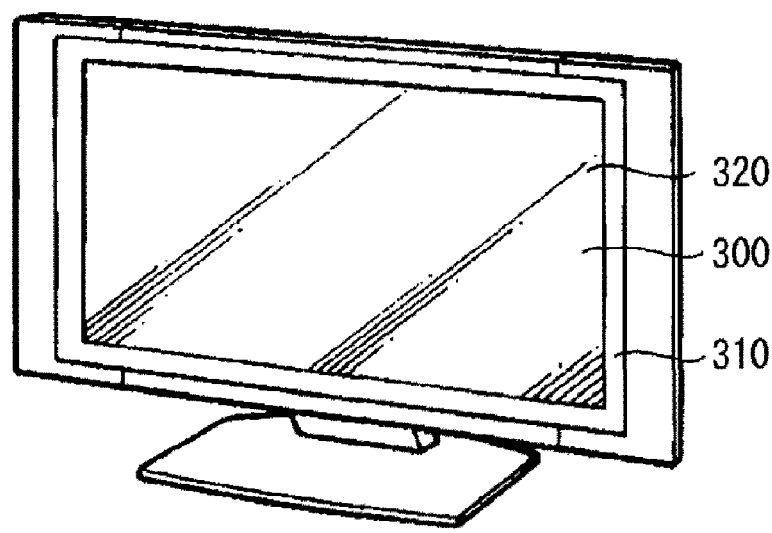
FIG. 25 is a perspective view illustrating appearance of Application example 1 of the display in the first to third embodiments.

FIG. 25 illustrates appearance of a television to which the display according to the embodiments is applied. This television device includes, for example, an image display screen 300 including a front panel 310 and a filter glass 320. The image display screen 300 is configured with the display according to the embodiments.

Application Example 2

Figure 26A:
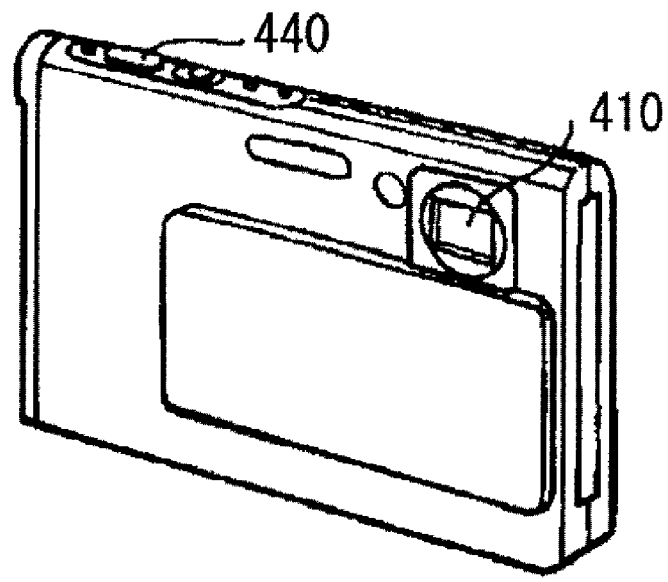
FIG. 26A is a perspective view illustrating appearance as seen from a front side of Application example 2.
Figure 26B:
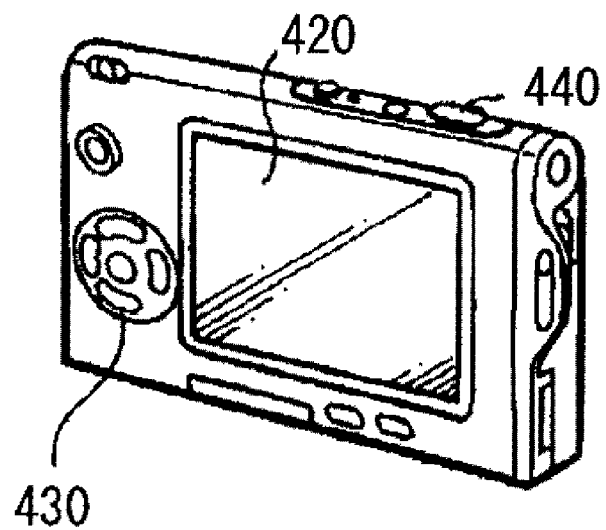
FIG. 26B is a perspective view illustrating appearance as seen from a rear side of Application example 2.

FIGS. 26A and 26B illustrate appearance of a digital camera to which the display according to the embodiments is applied. This digital camera includes, for example, a flash light emitting section 410, a display 420, a menu switch 430, and a shutter button 440. The display 420 is configured with the display according to the embodiments.

Application Example 3

Figure 27:
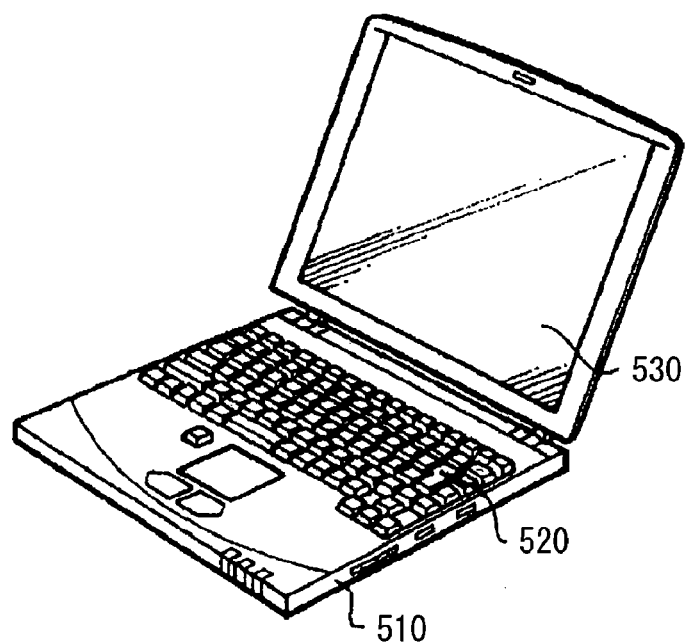
FIG. 27 is a perspective view illustrating appearance of Application example 3.

FIG. 27 illustrates appearance of a notebook personal computer to which the display according to the embodiments is applied. This notebook personal computer includes, for example, a body 510, a keyboard 520 for input operation of letters and the like, and a display 530 displaying image. The display 530 is configured with the display according to the embodiments.

Application Example 4

Figure 28:
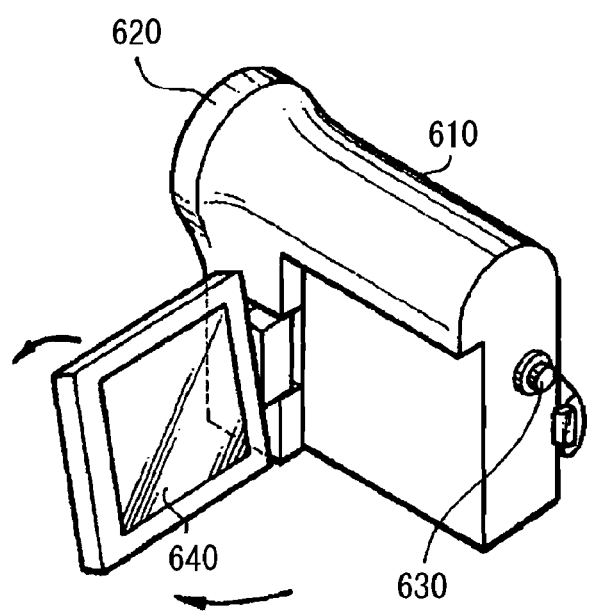
FIG. 28 is a perspective view illustrating appearance of Application example 4.
Figure 29:
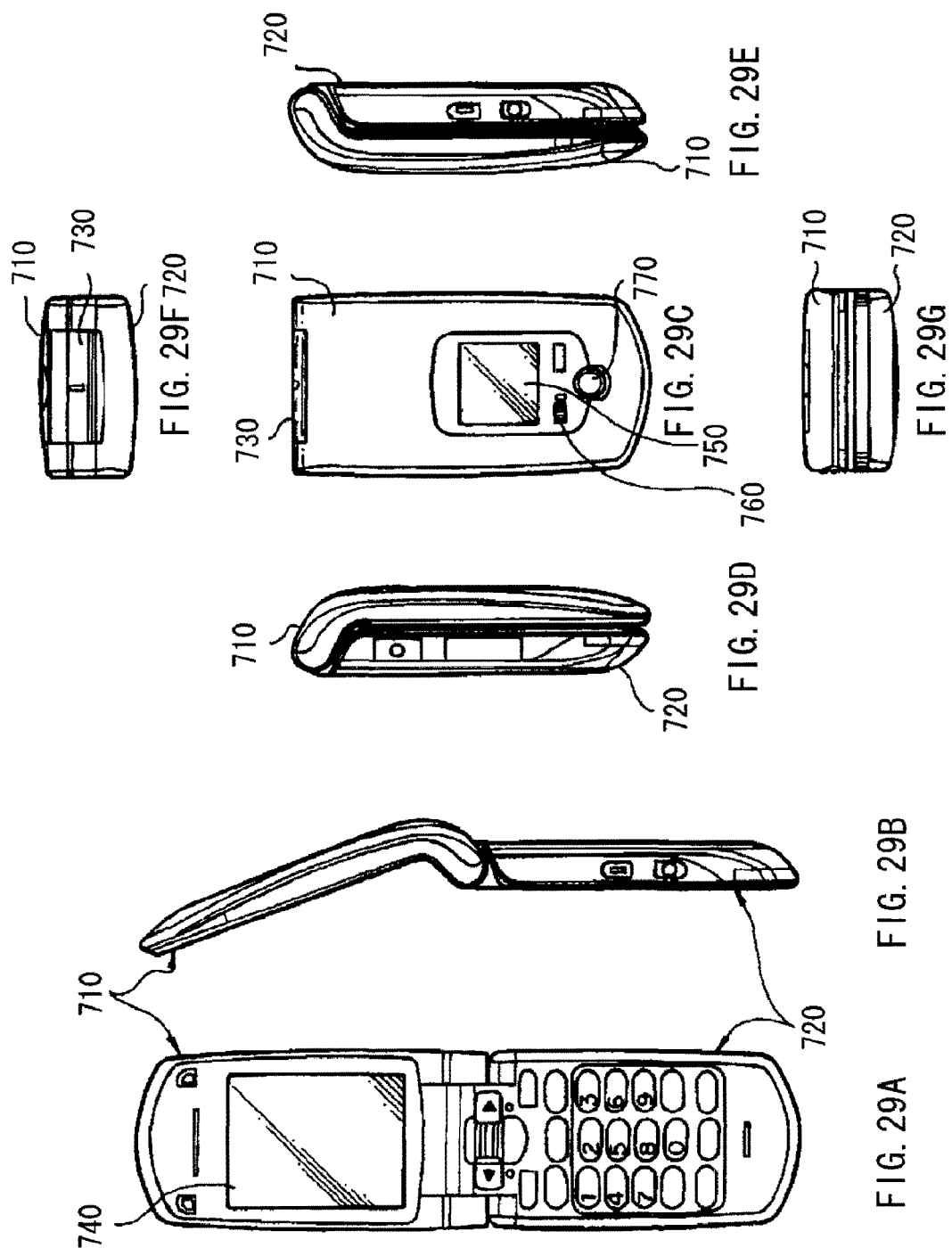
FIG. 29A is a front view in an opened state of Application example 5.
FIG. 29B is a side view in the opened state.
FIG. 29C is a front view in a closed state.
FIG. 29D is a left side view in the closed state.
FIG. 29E is a right side view in the closed state.
FIG. 29F is a top view in the closed state.
FIG. 29G is a bottom view in the closed state.

FIG. 28 illustrates appearance of a video camera to which the display according to the embodiments is applied. This video camera includes, for example, a body 610, a lens for imaging an object 620, a start/stop switch for imaging 630, and a display 640. The display 640 is configured with the display according to the embodiments.

Application Example 5

FIGS. 29A to 29G illustrate appearance of a cellar phone to which the display according to the embodiments is applied. In this cellar phone, for example, a top case 710 and a bottom case 720 are connected with a connecting section (hinge) 730 in between. The cellar phone includes a display 740, a sub-display 750, a picture light 760, and a camera 770. The display 740 and the sub-display 750 are configured with the display according to the embodiments.

Hereinbefore, the present invention is described with the embodiments and the examples. However, the present invention is not limited to the above embodiments and examples, and various modifications may be made. For example, in the embodiments and the examples, the case where a radiation ray such as the laser light or the flash lamp is irradiated in the transfer step is described. However, irradiation may be performed with a radiation ray of other light sources such as a heat bar and a thermal head.

Figure 30:
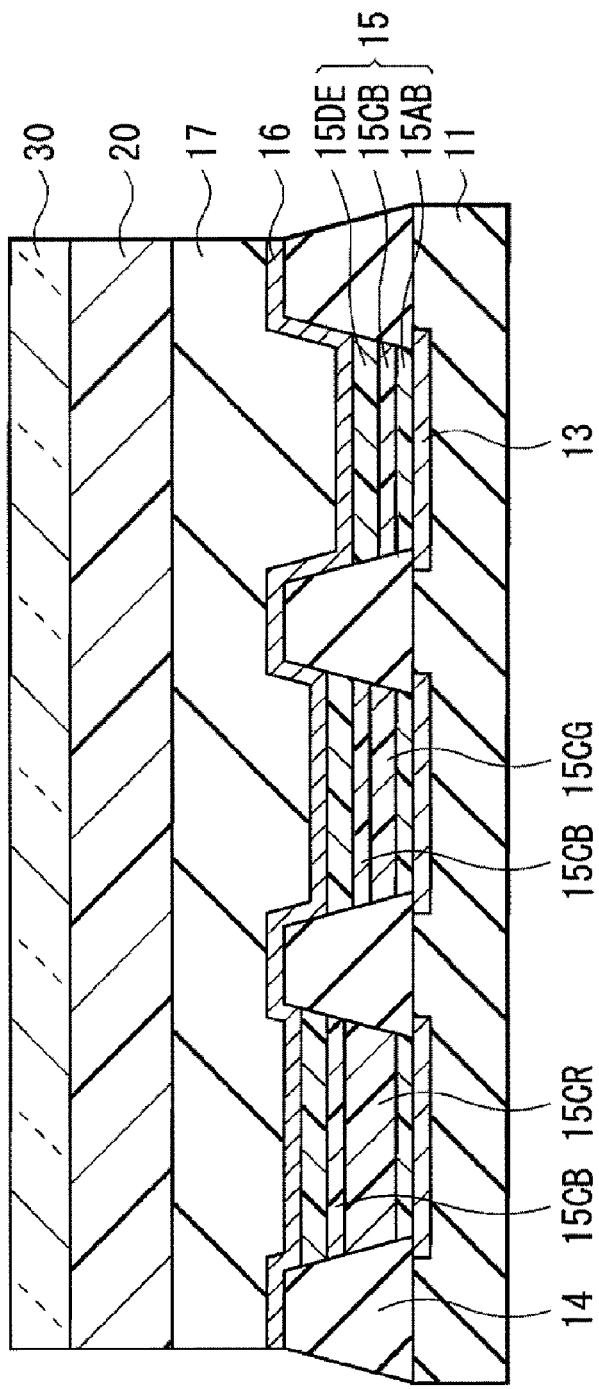
FIG. 30 is a cross-sectional view illustrating the configuration of a display region after formation of a blue-light emitting layer.

In the above embodiments, the case where all of the light emitting layers 15C of R, G, and B are formed by transfer method is described. However, as illustrated in FIG. 30, after forming only the red light emitting layer 15CR and the green light emitting layer 15CG by transfer method, the blue light emitting layer 15CB may be deposited over the whole surface by evaporation method. At this time, in the organic light emitting device 10R, although the red light emitting layer 15CR and the blue light emitting layer 15CB are formed, energy transfer occurs to red which has the lowest energy level, and a red light emission becomes dominant. In the organic light emitting device 10G, although the green light emitting layer 15CG and the blue light emitting layer 15CB are formed, energy transfer occurs to green which has the lowest energy level, and a green light emission becomes dominant. In the organic light emitting device 10B, since only the blue light emitting layer 15CB is formed, a blue light emission is generated.

For example, the material and the thickness of each layer, the deposition method, the deposition conditions, and the irradiation conditions of the laser light described in the above embodiments and examples are not limited. Other material and thickness are possible. Other deposition methods, deposition conditions, and irradiation conditions are possible. For example, the first electrode 13 may include a dielectric multilayer film.

For example, although the case where the first electrode 13, the organic layer 15, and the second electrode 16 are stacked in order from the driving substrate 11 side on the driving substrate 11 and light is taken out from the sealing substrate 30 side is described in the embodiments, the stacking order may be in reverse order. In this case, it is possible that the second electrode 16, the organic layer 15, and the first electrode 13 are stacked in order from the driving substrate 11 side on the driving substrate 11, and the light is taken out from the driving substrate 11 side.

For example, although the case where the first electrode 13 is regarded as an anode and the second electrode 16 is regarded as a cathode is described in the embodiments, it is possible that the anode and the cathode are switched. In this case, the first electrode 13 may be regarded as a cathode and the second electrode 16 may be regarded as an anode. Moreover, it is possible that the first electrode 13 is regarded as a cathode and the second electrode 16 is regarded as an anode and the second electrode 16, and the organic layer 15, and the first electrode 13 are stacked in this order from the driving substrate 11 side on the driving substrate 11. Then, the light is taken from the driving substrate 11 side.

In the embodiments, although the layer configuration of the organic light emitting devices 10R, 10G, and 10B is specifically described as above, it is not always necessary to include all of the layers, and other layers may further be included. For example, between the first electrode layer 13 and the organic layer 15, a hole injecting thin film layer of chrome oxide (III) ($Cr_2O_3$), ITO (indium-tin oxide: oxide mixed film of indium (In) and tin (Sn)), or the like may be provided.

Although the case where the second electrode 16 is configured with a semi-transmitting electrode and light generated in the light emitting layer 15C is taken out from the second electrode 16 side is described in the embodiments, the generated light may be taken out from the first electrode 13 side. In this case, it is preferable that the second electrode 16 have reflectance as high as possible to improve the light emission efficiency.

Moreover, although the case of the active matrix display is described in the embodiments, the present invention is applicable to a passive matrix display. The configuration of the pixel driving circuit for driving the active matrix is not limited to the aspects described in the above embodiments, and a capacitor or a transistor may be added if necessary. In that case, in addition to the signal line driving circuit 120 and the scanning line driving circuit 130 described above, a necessary driving circuit may be added according to a change in the pixel driving circuit.

Although the present invention has been described with reference to the embodiments and modification, the invention is not limited to those, and various modifications may be made.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a display in which an organic light emitting device including a first electrode, an insulating layer including an aperture corresponding to a light emitting region of the first electrode, a plurality of organic layers including a light emitting layer, and a second electrode in this order is formed on a driving substrate, the method comprising the steps of:
   forming the first electrode, the insulating layer, and some of the plurality of organic layers on the driving substrate;
   providing a donor substrate comprising (a) a base layer, (b) a photothermal conversion layer arranged on a portion of the base layer; and (c) at least two heat insulating layers over the base layer and the photothermal conversion layer;
   forming a transfer layer on the heat insulating layers made of a light emission material which is released by sublimation or vaporization from the donor substrate upon irradiation of the donor substrate with a laser light, each heat insulating layer has a refraction index that is different than that of the other heat insulating layers;
   irradiating the laser light while the transfer layer and the driving substrate face each other, and sublimating or vaporizing the transfer layer so that the transfer layer is transferred to the driving substrate, thereby forming a light emitting layer; and
   forming the remainder of the plurality of organic layers and the second electrode.

2. The method of manufacturing the display according to claim 1, wherein the refraction indices and thicknesses of the two or more heat insulating layers are such that reflectance in a continuous wavelength region of 100 nm or more in a light emission band in the laser light is 0.1 or less.

3. The method of manufacturing the display according to claim 2, wherein the heat insulating layers include:

a first heat insulating layer made of $SiO_2$, SiN, SiON, or $Al_2O_3$ and having a thickness of 50 nm or more and 250 nm or less, and a second heat insulating layer made of a-Si and having a thickness of 15 nm or more and 80 nm or less in this order from the base side.

4. A method of manufacturing a display in which an organic light emitting device including a first electrode, an insulating layer including an aperture corresponding to a light emitting region of the first electrode, a plurality of organic layers including a light emitting layer, and a second electrode in this order is formed on a driving substrate, the method comprising the steps of:

forming the first electrode, the insulating layer, and some of the plurality of organic layers on the driving substrate;

providing a donor substrate comprising (a) a base layer, (b) a photothermal conversion layer arranged on a portion of the base layer; (c) at least two first heat insulating layers over the base layer and the photothermal conversion layer (c) a convex structure arranged in a region on one of the first heat insulating layers not coincident with the photothermal conversion layer, and (d) a pollution preventing layer including a first portion formed on a top surface of the convex structure and a second portion formed on a top surface of the one of the heat insulating layers, the first portion and the second portion being separated from each other;

forming a transfer layer on the heat insulating layers made of a light emission material which is released by sublimation or vaporization from the donor substrate upon irradiation of the donor substrate with a laser light, each heat insulating layer having a refraction index that is different than that of the other insulating layers;

irradiating the laser light while the transfer layer and the driving substrate face each other, and sublimating or vaporizing the transfer layer so that the transfer layer is transferred to the driving substrate, thereby forming a light emitting layer; and forming the remainder of the plurality of organic layers and the second electrode.

5. The method of manufacturing the display according to claim 4, wherein the convex structure has a cross section of an inverse tapered shape with a bottom width smaller than a top width.

6. The method of manufacturing the display according to claim 4, wherein the convex structure has a height of 0.3 μm or more and 10 μm or less.

7. The method of manufacturing the display according to claim 4, wherein the pollution preventing layer has a thickness of 25 nm or more and 500 nm or less.

8. The method of manufacturing the display according to claim 4, wherein a second heat insulating layer is provided between the base layer and the photothermal conversion layer.

9. The method of manufacturing the display according to claim 4, wherein plural transfer layers containing light emission material of different colors for each region separated by the convex structures are formed, and light emitting layers of two or more colors are formed on the driving substrate in a one-time transfer period.

* * * * *